US012532452B2

(12) United States Patent
Liu et al.

(10) Patent No.: US 12,532,452 B2
(45) Date of Patent: Jan. 20, 2026

(54) SEMICONDUCTOR STRUCTURE AND MANUFACTURING METHOD THEREOF

(71) Applicants: CHANGXIN MEMORY TECHNOLOGIES, INC., Hefei (CN); CHANGXIN JIDIAN (BEIJING) MEMORY TECHNOLOGIES CO., LTD., Beijing (CN)

(72) Inventors: Xiang Liu, Hefei (CN); Bin Yang, Hefei (CN)

(73) Assignees: CHANGXIN MEMORY TECHNOLOGIES, INC., Hefei (CN); CHANGXIN JIDIAN (BEIJING) MEMORY TECHNOLOGIES CO., LTD., Beijing (CN)

( * ) Notice: Subject to any disclaimer, the term of this patent is extended or adjusted under 35 U.S.C. 154(b) by 454 days.

(21) Appl. No.: 18/149,188

(22) Filed: Jan. 3, 2023

(65) Prior Publication Data

US 2023/0363139 A1 Nov. 9, 2023

Related U.S. Application Data

(63) Continuation of application No. PCT/CN2022/103650, filed on Jul. 4, 2022.

(30) Foreign Application Priority Data

May 6, 2022 (CN) .......................... 202210484142.4

(51) Int. Cl.
*H10B 12/00* (2023.01)
(52) U.S. Cl.
CPC .................................... *H10B 12/20* (2023.02)
(58) Field of Classification Search
CPC ........ H10B 12/20; H10B 12/05; H10B 12/30; H10D 30/60; H10D 64/021; H10D 64/518;
(Continued)

(56) References Cited

U.S. PATENT DOCUMENTS 9,041,070 B2 5/2015 Eguchi et al.
2007/0138543 A1 6/2007 Saito
(Continued)

FOREIGN PATENT DOCUMENTS

CN 1645629 A 7/2005
CN 103915500 A 7/2014
(Continued)

OTHER PUBLICATIONS

CN 111293177 A translation (Year: 2020).*
(Continued)

*Primary Examiner* — Yara B Green
*Assistant Examiner* — Coralie A Nettles
(74) *Attorney, Agent, or Firm* — Kilpatrick Townsend & Stockton LLP

(57) ABSTRACT

The present disclosure provides a semiconductor structure and a manufacturing method thereof, and relates to the technical field of semiconductors. The semiconductor structure includes a substrate and a stacked structure located on the substrate; a doped region located between the stacked structure and the substrate, where on a section perpendicular to the substrate, the doped region includes a top doped region, a bottom doped region, and an intermediate doped region connecting the top doped region to the bottom doped region, in a direction parallel to the substrate, the top doped region has a first width, the bottom doped region has a second width, the intermediate doped region has a gradually changing third width, the first width is greater than the second width, and the third width decreases gradually along a direction away from the substrate.

10 Claims, 16 Drawing Sheets

(58) Field of Classification Search
CPC ............. H10D 30/024; H10D 30/6213; H10D 30/6219; H01L 21/2815
See application file for complete search history.

(56) References Cited

U.S. PATENT DOCUMENTS

| | | |
|---|---|---|
| 2008/0153236 A1 | 6/2008 | Cheng et al. |
| 2012/0261736 A1* | 10/2012 | Hsu ..................... H10D 64/035 |
| | | 257/E21.409 |
| 2014/0027857 A1* | 1/2014 | Yin ........................ H10D 84/83 |
| | | 438/270 |
| 2014/0252473 A1* | 9/2014 | Loechelt ............. H10D 30/028 |
| | | 257/342 |
| 2015/0318282 A1 | 11/2015 | Rodder et al. |
| 2019/0214479 A1 | 7/2019 | Jambunathan et al. |

FOREIGN PATENT DOCUMENTS

| | | | | |
|---|---|---|---|---|
| CN | 207587740 U | * | 7/2018 | |
| CN | 111293177 A | * | 6/2020 | ........... H10D 62/125 |
| CN | 114628526 A | | 6/2022 | |
| WO | 2007093930 A1 | | 8/2007 | |

OTHER PUBLICATIONS

CN 207587740 U translation (Year: 2017).*
International Search Report cited in PCT/CN2022/103650 mailed Jan. 18, 2023, 9 pages.
First Office Action cited in CN202210484142.4, mailed Jun. 23, 2022, 14 pages.

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2022/103650, filed on Jul. 4, 2022, which claims the priority to Chinese Patent Application 202210484142.4, titled "SEMICONDUCTOR STRUCTURE AND MANUFACTURING METHOD THEREOF" and filed on May 6, 2022. The entire contents of International Application No. PCT/CN2022/103650 and Chinese Patent Application 202210484142.4 are incorporated herein by reference.

TECHNICAL FIELD

The present disclosure relates to, but is not limited to, a semiconductor structure and a manufacturing method thereof.

BACKGROUND

The dynamic random access memory (DRAM) usually includes an array region and a core region outside the array region. The array region includes transistors arranged in an array.

With the continuous improvement of chip integration, the critical dimension of transistor is reduced, and the channel length of transistor is also reduced, which may lead to a short-channel effect in transistors. The short-channel effect may cause current leakage of the transistor, thus seriously affecting the electrical performance of the transistor. In addition, as the critical dimension of the transistor is reduced, the size of the gate is also reduced. As a result, the ability of the gate to control the channel is reduced, the sensitivity of the transistor is affected, and the yield of the semiconductor structure is reduced.

Therefore, how to reduce the short channel effect of the transistor in the semiconductor structure, improve the ability of the gate to control the channel, and improve the yield of the semiconductor structure are technical problems to be solved urgently at present.

SUMMARY

An overview of the subject described in detail in the present disclosure is provided below. This overview is not intended to limit the protection scope of the claims.

The present disclosure provides a semiconductor structure and a manufacturing method thereof.

A first aspect of the present disclosure provides a semiconductor structure. The semiconductor structure includes:
 a substrate and a stacked structure located on the substrate; and
 a doped region located between the stacked structure and the substrate, where on a section perpendicular to the substrate, the doped region includes a top doped region, a bottom doped region, and an intermediate doped region connecting the top doped region to the bottom doped region, in a direction parallel to the substrate, the top doped region is has a first width, the bottom doped region has a second width, the intermediate doped region has a gradually changing third width, the first width is greater than the second width, and the third width decreases gradually along a direction away from the substrate.

A second aspect of the present disclosure provides a method of manufacturing a semiconductor structure, including:
 providing a substrate;
 forming a dielectric structure on the substrate, where the dielectric structure covers a partial surface of the substrate;
 forming an auxiliary layer partially covering a surface of the substrate at the outside of the dielectric structure, where a horizontal width of the auxiliary layer decreases gradually in a direction away from the substrate;
 patterning the substrate based on the auxiliary layer and the dielectric structure, and transferring a pattern of the auxiliary layer into the substrate, to form, in the substrate, an intermediate doped region with a horizontal width decreasing gradually in the direction away from the substrate, where the substrate below the dielectric structure is unetched, and forms a top doped region with a first width, and the substrate that is not covered by the auxiliary layer and the dielectric structure is partially removed through etching, to form an initial bottom doped region, where the intermediate doped region connects the initial bottom doped region to the top doped region; and
 forming a stacked structure at least covering the intermediate doped region and a part of the initial bottom doped region, where a part of the initial bottom doped region covered by the stacked structure forms a bottom doped region, the bottom doped region has a second width, and the first width is greater than the second width.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Exemplary embodiments of the present disclosure provide a semiconductor structure and a manufacturing method thereof. A stacked structure of the semiconductor structure covers a doped region, and the doped region includes an intermediate doped region. On a section perpendicular to the substrate direction, the horizontal width of the intermediate doped region gradually decreases along the direction away from the substrate, such that the doped region is enabled to be of a fin-shaped structure that protrudes outward relative to the substrate, thereby increasing a contact area between stacked structure and the doped region.

Figure 1:
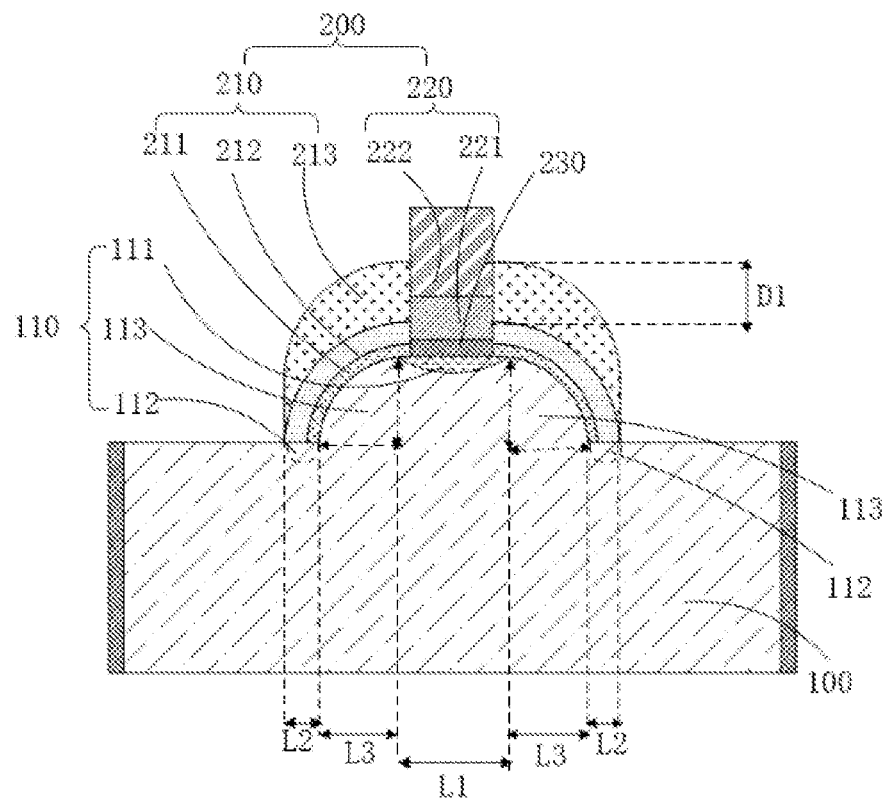
FIG. 1 is a schematic structural diagram of a semiconductor structure according to an exemplary embodiment.
Figure 4:
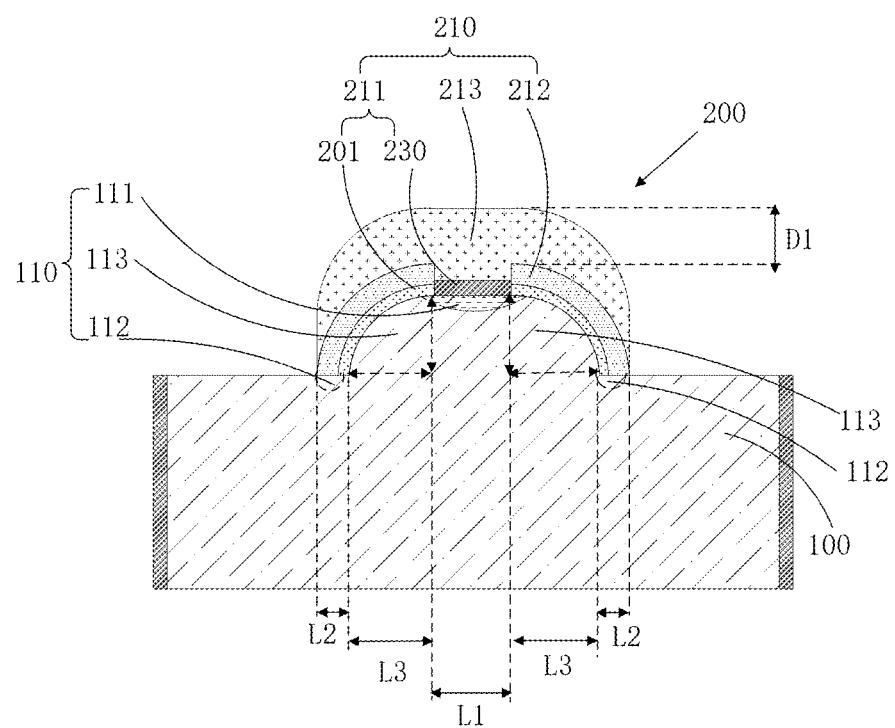
FIG. 4 is a schematic structural diagram of a semiconductor structure according to an exemplary embodiment.

Exemplary embodiments of the present disclosure provide a semiconductor structure. As shown in FIG. 1 or 4, the semiconductor structure includes a substrate 100 and a stacked structure 200 on the substrate 100. The semiconductor structure further includes a doped region 110 located between the stacked structure 200 and the substrate 100, where on a section perpendicular to the substrate 100, that is, the cross section shown in FIG. 1, the doped region 110 includes a top doped region 111, a bottom doped region 112, and an intermediate doped region 113 connecting the top doped region 111 to the bottom doped region 112, in a direction parallel to the substrate 100, the top doped region 111 has a first width L1, the bottom doped region 112 has a second width L2, the intermediate doped region 113 has a gradually changing third width L3, the first width L1 is greater than the second width L2, and the third width L3 decreases gradually along a direction away from the substrate 100. That is, taking the orientation shown in FIG. 1 as the criterion, along the direction from bottom to top, the third width L3 gradually decreases.

A top surface of the intermediate doped region 113 is higher than a top surface of the bottom doped region 112. The maximum width of the intermediate doped region 113 is $L3_{MAX}$, and $L3_{MAX}$ is greater than the second width L2.

In some embodiments, the range of the first width L1 is 5 nm to 50 nm, the range of the second width L2 is 1 nm to 20 nm, the range of the third width $L3_{MAX}$ is 1 nm to 100 nm, and the variation range of the third width L3 is 0 to $L3_{MAX}$.

The first width L1 may be 5 nm, 8 nm, 12 nm, 15 nm, 20 nm, 25 nm, 30 nm, 35 nm, nm, 45 nm, or 50 nm. The second width L2 may be 1 nm, 2 nm, 3 nm, 4 nm, 5 nm, 6 nm, 7 nm, 8 nm, 9 nm, or 10 nm. The variation range of the third width L3 may be 0 nm to 1 nm, 10 nm, 20 nm, 30 nm, 35 nm, 50 nm, 60 nm, or 70 nm, 40 nm to 80 nm, 50 nm to 90 nm, or 60 nm to 100 nm.

For example, the first width L1 may be 5 nm, the second width L2 may be 1 nm, the third width $L3_{MAX}$ may be 5 nm, and the variation range of the third width L3 is 0 nm to 5 nm. Alternatively, the first width L1 may be 15 nm, the second width L2 may be 4 nm, the third width $L3_{MAX}$ may be 10 nm, and the variation range of the third width L3 is 0 nm to nm. Alternatively, the first width L1 may be 25 nm, the second width L2 may be 7 nm, the third width $L3_{MAX}$ may be 20 nm, and the variation range of the third width L3 is 0 nm to 20 nm.

In some embodiments, $L3_{MAX}$ is greater than the first width L1. For example, the first width L1 may be 30 nm, the second width L2 may be 6 nm, the third width $L3_{MAX}$ may be nm, and the variation range of the third width L3 is 0 nm to 40 nm. Alternatively, the first width L1 may be 15 nm, the second width L2 may be 8 nm, the third width $L3_{MAX}$ may be 80 nm, and the variation range of the third width L3 is 0 nm to 80 nm. Alternatively, the first width L1 may be 50 nm, the second width L2 may be 10 nm, the third width $L3_{MAX}$ may be 100 nm, and the variation range of the third width L3 is 0 nm to 100 nm.

Doping types of the bottom doped region 112 and the intermediate doped region 113 are the same, and doping types of the top doped region 111 and the intermediate doped region 113 are the same or different.

In some embodiments, as shown in FIG. 1 or 4, the stacked structure 200 includes a gate stack structure 210, the gate stack structure 210 includes a gate dielectric layer 211 in contact with the doped region 110 and a first gate conductive layer 212 and a second gate conductive layer 213 on the gate dielectric layer 211, and on the section perpendicular to the substrate 100, the first gate conductive layer 212 is thinner than the second gate conductive layer 213. The gate stack structure 210 covers at least the bottom doped region 112 and the intermediate doped region 113 of the doped region 110. In some embodiments, the gate stack structure 210 may also cover the top doped region 111.

In some embodiments, on the section perpendicular to the direction of the substrate 100, the thickness of the first gate conductive layer 212 is 1 nm to 40 nm, such as 1 nm to 5 nm, 5 nm to 10 nm, 10 nm to 15 nm, 15 nm to 20 nm, 20 nm to 25 nm, 25 nm to 30 nm, 30 nm to 35 nm, or 35 nm to 40 nm.

In some embodiments, as shown in FIG. 1 or 4, the second gate conductive layer 213 has a first thickness D1 on the section perpendicular to the substrate 100. In a direction parallel to the substrate 100, from the bottom doped region 112 to the top doped region 111, the first thickness D1 gradually increases.

The variation range of the first thickness D1 is 0 nm to 50 nm. For example, the variation range of the first thickness D1 may be 0 nm to 1 nm, 5 nm, 10 nm, 15 nm, 20 nm, 25 nm, 35 nm, 45 nm, or 50 nm.

In the transistor having the gate stack structure 210 and the doped region 110 in this embodiment, the outer surface of the doped region 110 covered by the gate stack structure 210 is the channel of the transistor. In this embodiment, the third width L3 of the intermediate doped region 113 gradually decreases along the direction away from the substrate 100. The intermediate doped region 113 makes the doped region 110 formed with a fin structure disposed in a direction away from the substrate 100. The doped region 110 is raised relative to the substrate 100, which increases the contact area between the doped region 110 and the stacked structure 200, and further increases the contact area between the gate stack structure 210 and the channel. An increased channel length can avoid or reduce short channel effects. In addition, the gate stack structure 210 of this embodiment covers the channel. When the semiconductor structure is powered on, at least different positions of the contact surface between the gate stack structure 210 and the intermediate doped region 113 generate control electric fields toward the center of the intermediate doped region 113. The control electric fields generated by the gate stack structure 210 gather at the center of the doped region 110, which can increase the strength of the control electric fields, thereby improving the ability of the gate stack structure 210 to control the channel. Therefore, the semiconductor structure of this embodiment can further reduce the feature size of the device and improve the integration degree of the semiconductor device.

In some embodiments, as shown in FIG. 1 or 4, the first gate conductive layer 212 includes a work function regulating material, and the second gate conductive layer 213 includes a metal conductive material. The first gate conductive layer 212 is disposed between the doped region 110 and the second gate conductive layer 213. The first gate conductive layer 212 is configured to adjust the work function of the second gate conductive layer 213, which is beneficial to reducing the threshold voltage of the semiconductor structure. For example, the first gate conductive layer 212 includes an N-type or P-type work function regulating material. In this embodiment, the material of the first gate conductive layer 212 may include polysilicon, and the work function of polysilicon can be changed by adjusting the type of doping ions and the doping concentration. Therefore, the work function of the gate structure formed by the first gate conductive layer 212 and the second gate conductive layer 213 is adjusted to reduce the threshold voltage.

In this embodiment, the thickness of the first gate conductive layer 212 is close to the gate thickness of the planar transistor. Because the thickness of the first gate conductive layer 212 is sufficiently small and uniform, when the material of the first gate conductive layer 212 includes polysilicon with a uniform lattice, and crystal orientations in the polysilicon are the same, the first gate conductive layer 212 has good conductivity, which is beneficial for the scaling of the device size.

In some embodiments, the semiconductor structure further includes a first dielectric layer 230 located between the stacked structure 200 and the top doped region 111. The gate dielectric layer 211 is connected to the first dielectric layer 230. On a section perpendicular to the direction of the substrate 100, the thicknesses of the gate dielectric layer 211 and the first dielectric layer 230 are the same or different.

Figure 5:
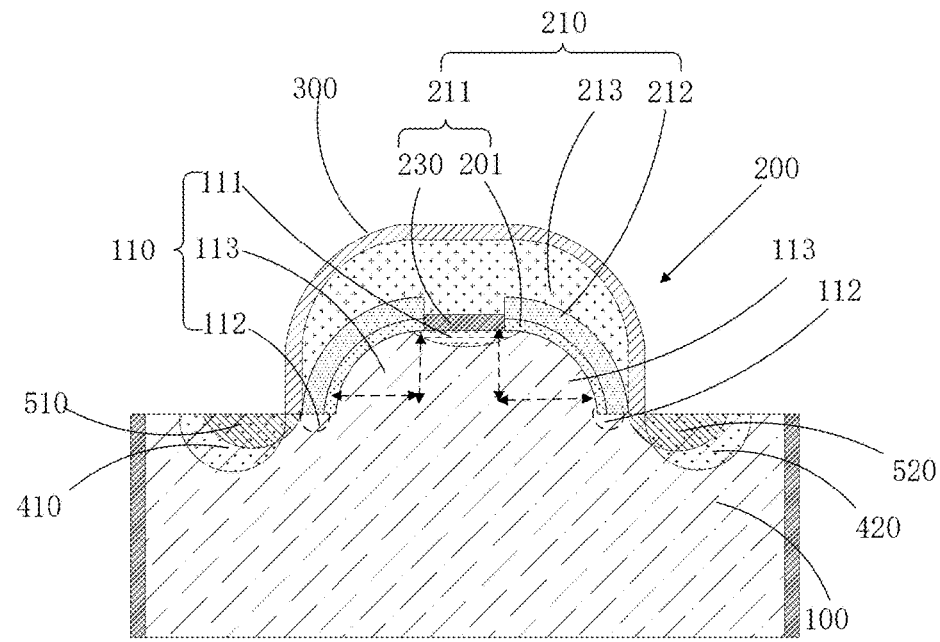
FIG. 5 is a schematic structural diagram of a semiconductor structure according to an exemplary embodiment.
Figure 6:
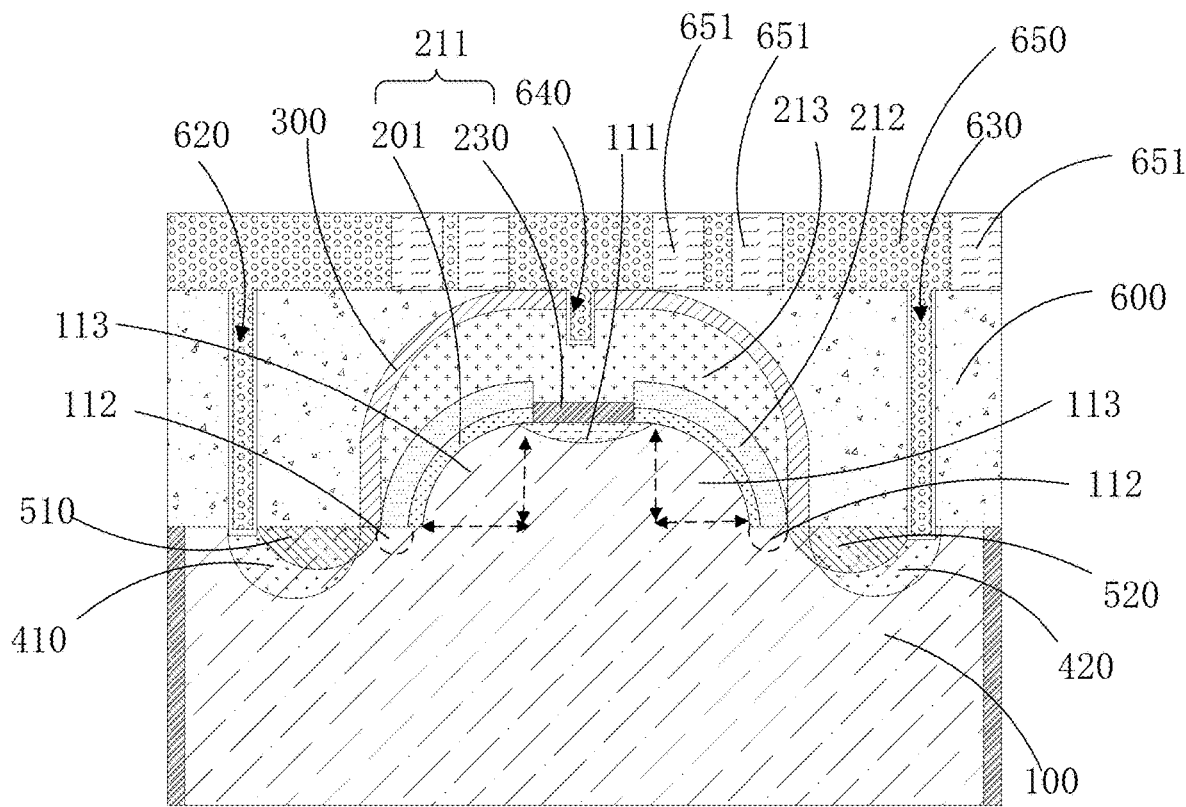
FIG. 6 is a schematic structural diagram of a semiconductor structure according to an exemplary embodiment.

In an example, in the semiconductor structure of this example, with reference to FIG. 4, the bottom doped region 112, the intermediate doped region 113, and the top doped region 111 of the doped region 110 have the same conductivity type. That is, the bottom doped region 112, the intermediate doped region 113, and the top doped region 111 may all have a P-type conductivity type or an N-type conductivity type. As shown in FIG. 4, 5, or 6, in the semiconductor structure of this example, the stacked structure 200 only includes the gate stack structure 210.

In this example, the gate dielectric layer 211 includes the gate dielectric layer 201 and the first dielectric layer 230 that are connected to each other. The gate dielectric layer 201 is located among the gate stack structure 210, the bottom doped region 112, and the intermediate doped region 113, and the first dielectric layer 230 is located between the stacked structure 200 and the top doped region 111. The thicknesses of the gate dielectric layer 201 and the first dielectric layer 230 are the same or different. For example, the thickness of the gate dielectric layer 201 may be the same as that of the first dielectric layer 230. Alternatively, the thickness of the gate dielectric layer 201 may also be greater or smaller than the thickness of the first dielectric layer 230.

As shown in FIG. 4, 5, or 6, the first gate conductive layer 212 is located on the bottom doped region 112 and the intermediate doped region 113, and the first gate conductive layer 212 is in contact with the gate dielectric layer 201. The second gate conductive layer 213 is located above the bottom doped region 112, the intermediate doped region 113 and the top doped region 111. A part of the second gate conductive layer 213 is in contact with the first gate conductive layer 212, and another part of the second gate conductive layer 213 is in contact with the first dielectric layer 230.

In the semiconductor structure of this example, the gate stack structure 210 covers the entire doped region 110. The contact surface between the gate stack structure 210 and the doped region 110 is the channel of the transistor. The transistor in this example has a longer channel. Control electric fields are generated at different positions of the contact surfaces between the gate stack structure 210 and the top doped region 111 as well as the intermediate doped region 113 in the direction of the center of the intermediate doped region 113. The intensity of the control electric fields gathered at the central position of the doped region 110 is larger, which further increases the ability of the gate stack structure 210 to control the channel.

In this example, the second gate conductive layer 213 not only covers the first gate conductive layer 212 but also covers the first dielectric layer 230 on the top doped region 111. The percentage of the second gate conductive layer 213 in the gate stack structure 210 is increased, which can improve the storage capability and control capability of the transistor.

In another example, in the semiconductor structure, with reference to FIG. 1, the bottom doped region 112 and the intermediate doped region 113 of the doped region 110 have the same conductivity type. Doping types of the top doped region 111 and the intermediate doped region 113 are the same or different. That is, in this embodiment, the bottom doped region 112 and the intermediate doped region 113 both have the N-type conductivity type, and the top doped region 111 has the P-type conductivity type, or vice versa.

Figure 2:
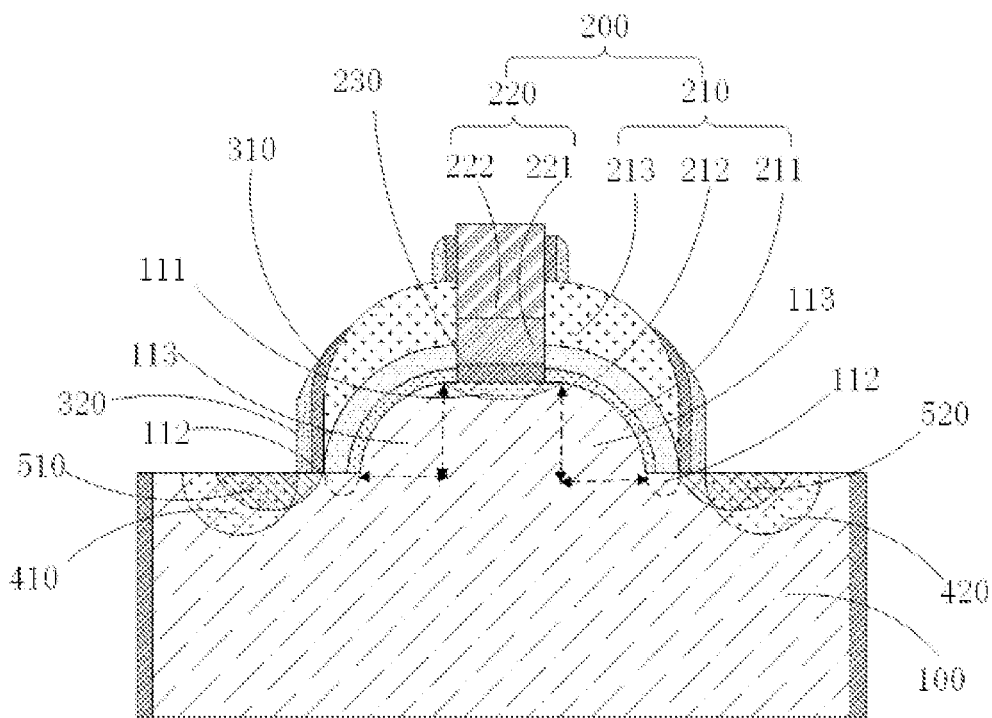
FIG. 2 is a schematic structural diagram of a semiconductor structure according to an exemplary embodiment.
Figure 3:
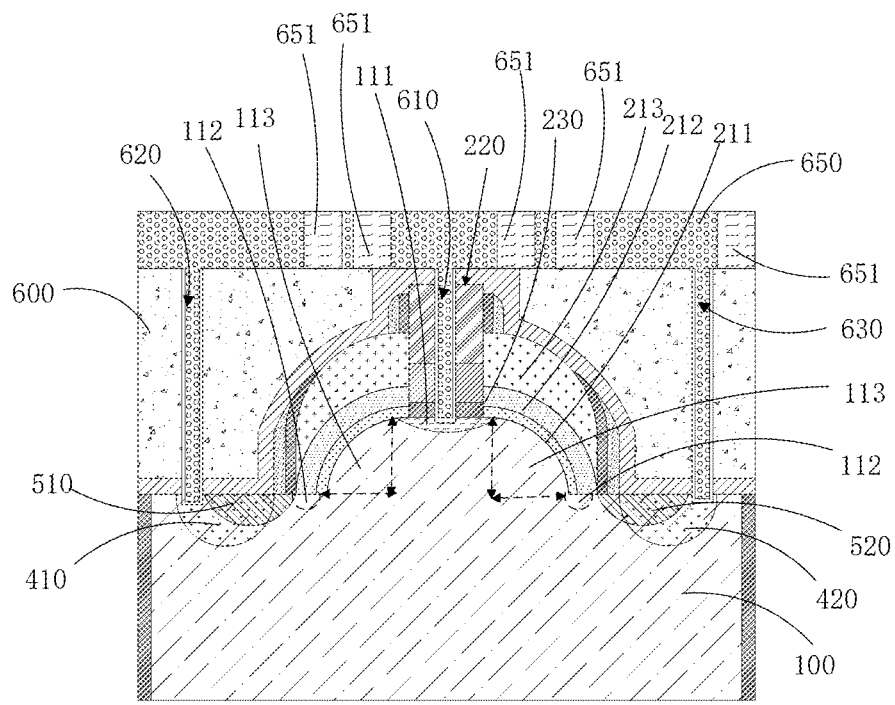
FIG. 3 is a schematic structural diagram of a semiconductor structure according to an exemplary embodiment.

As shown in FIGS. 1, 2, and 3, the semiconductor structure of this example, the stacked structure 200 includes a gate stack structure 210 located on the bottom doped region 112 and the intermediate doped region 113 and a dielectric stack structure 220 located on the top doped region 111. The first dielectric layer 230 is disposed between the dielectric stack structure 220 and the top doped region 111.

As shown in FIG. 1, 2, or 3, in the direction perpendicular to the substrate 100, the gate stack structure 210 includes a gate dielectric layer 211, a first gate conductive layer 212, and a second gate conductive layer 213 that are sequentially arranged on the bottom doped region 112 and the intermediate doped region 113. On a section perpendicular to the substrate 100, the thicknesses of the gate dielectric layer 211 and the first dielectric layer 230 are the same or different. The thickness of the gate dielectric layer 211 may be the same as that of the first dielectric layer 230. Alternatively, the thickness of the gate dielectric layer 211 may also be greater or smaller than the thickness of the first dielectric layer 230.

As shown in FIGS. 1, 2, and 3, the dielectric stack structure 220 includes a second dielectric layer 221 and a third dielectric layer 222. On a section perpendicular to the substrate 100, the top surface of the second dielectric layer 221 is higher than the top surface of the first gate conductive layer 212. The top surface of the second dielectric layer 221 is lower than the top surface of the second gate conductive layer 213. The top surface of the third dielectric layer 222 is higher than the top surface of the second gate conductive layer 213.

In the semiconductor structure of this embodiment, the second gate conductive layer 213 is only disposed above the first gate conductive layer 212, and the second gate conductive layer 213 is in contact with the doped region 110 through the first gate conductive layer 212. In the direction perpendicular to the substrate 100, the second gate conductive layer 213 and the doped region 110 do not have a direct overlapping region, and the work functions of the gate stack structure 210 are uniform. Therefore, the metal conductive material in the second gate conductive layer 213 is prevented from affecting the threshold voltage of the transistor, to ensure that the semiconductor structure has good electrical properties.

In some embodiments, as shown in FIGS. 2 and 5, the semiconductor structure further includes an isolation structure 300 covering the stacked structure 200.

As shown in FIG. 2 or 5, the semiconductor structure further includes a source region 410 and a drain region 420 disposed in the substrate 100. In a direction parallel to the substrate 100, the source region 410 and the drain region 420 are located at two sides of the stacked structure 200.

In some embodiments, as shown in FIG. 2 or 5, the semiconductor structure further includes a first lightly doped region 510 and a second lightly doped region 520 disposed in the substrate 100. In a direction parallel to the substrate 100, the first lightly doped region 510 and the second lightly doped region 520 are located at two sides of the stacked structure 200. The first lightly doped region 510 is doped deeper than the source region 410, and the second lightly doped region 520 is doped shallower than the drain region 420.

As shown in FIG. 2 or 5, the first lightly doped region 510 is connected to the bottom doped region 112, and the second lightly doped region 520 is connected to the bottom doped region 112. The first lightly doped region 510 and the source region 410 are disposed at a same side, and a part of the first lightly doped region 510 is located between the source region 410 and the bottom doped region 112, to prevent the source region 410 from diffusing to the bottom doped region 112. The second lightly doped region 520 and the drain region 420 are disposed at a same side, and a part of the second lightly doped region 520 is located between the drain region 420 and the bottom doped region 112, to prevent the drain region 420 from diffusing to the bottom doped region 112. The first lightly doped region 510 and the second lightly doped region 520 reduce the overlapping range among the source region 410, the drain region 420, and the gate stack structure 210, such that the gate-induced drain leakage current of the semiconductor structure can be reduced or avoided, thereby making the electrical properties of the semiconductor structure more stable, and improving the service life of the semiconductor structure.

In some embodiments, as shown in FIG. 3 or 6, the semiconductor structure further includes a second plug 620 and a third plug 630, and the second plug 620 is disposed perpendicular to the substrate 100. The second plug 620 is in contact with the source region 410, the third plug 630 is disposed perpendicular to the substrate 100, and the third plug 630 is in contact with the drain region 420.

In some embodiments, as shown in FIG. 3, with reference to FIG. 1, the stacked structure 200 of the semiconductor structure includes a gate stack structure 210 and a dielectric stack structure 220. The semiconductor structure further includes a first plug 610, which penetrates through the dielectric stack structure 220 and is in contact with the top doped region 111.

In some embodiments, as shown in FIG. 6, with reference to FIG. 4, the stacked structure 200 of the semiconductor structure includes only the gate stack structure 210. The semiconductor structure further includes a fourth plug 640. The fourth plug 640 is perpendicularly disposed on the gate stack structure 210, and the fourth plug 640 is in contact with the second gate conductive layer 213.

An exemplary embodiment of the present disclosure provides a method of manufacturing a semiconductor structure. A semiconductor structure is not limited in this embodiment. Description is made below by taking the DRAM as an example.

Figure 25:
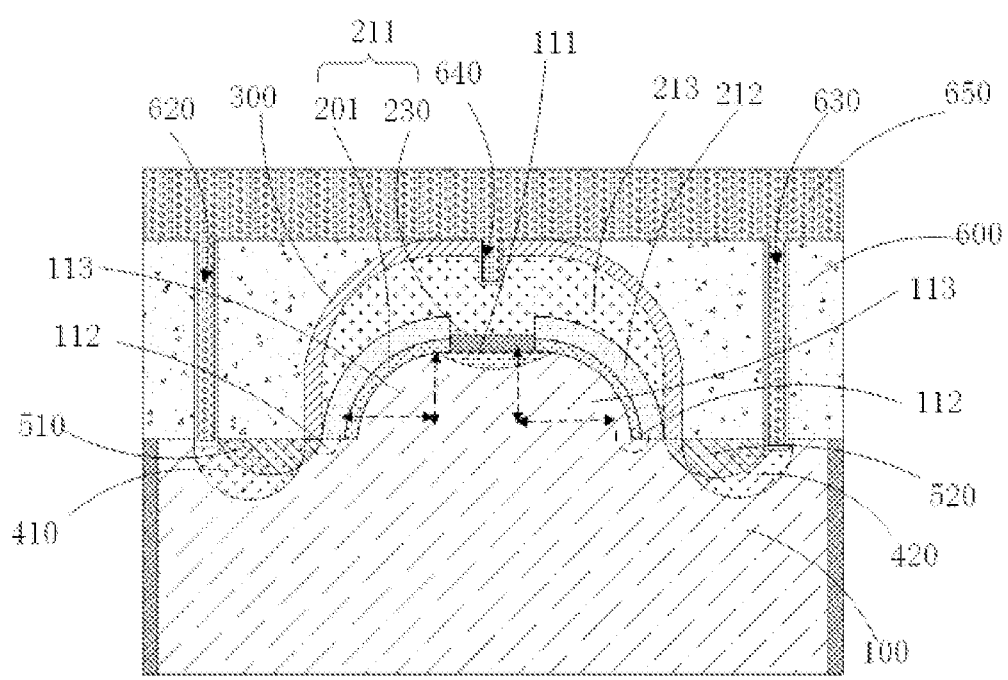
FIG. 25 is a schematic diagram of forming the second plug, the third plug, and a fourth plug in the dielectric layer according to an exemplary embodiment.
Figure 26:
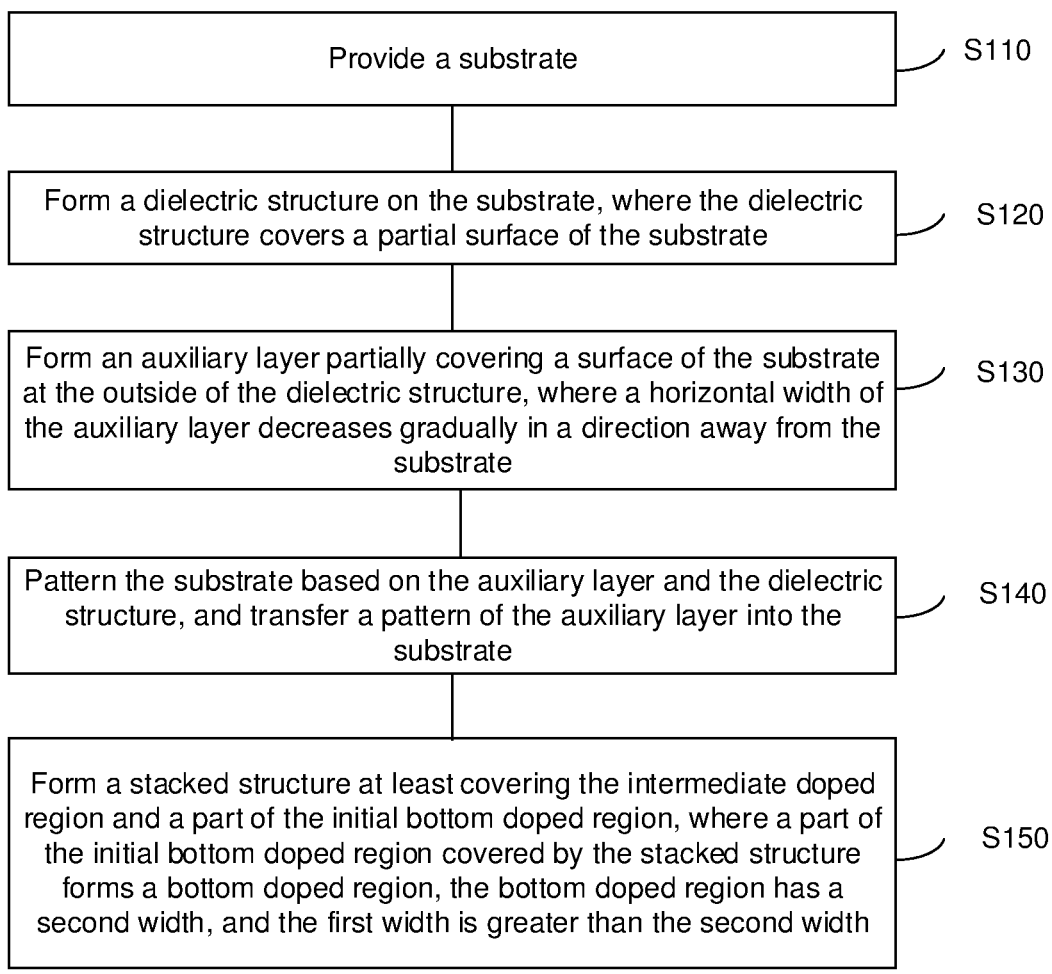
FIG. 26 is a flowchart of the method of manufacturing a semiconductor structure according to an exemplary embodiment.

FIG. 26 is a flowchart of a method of manufacturing a semiconductor structure according to an exemplary embodiment of the present disclosure. FIG. 7 to FIG. 25 are schematic diagrams of various stages of the method of manufacturing a semiconductor structure in this embodiment. The method of manufacturing a semiconductor structure in this embodiment is described below with reference to FIGS. 1 to 25. As shown in FIG. 26, the method of manufacturing a semiconductor structure in this embodiment includes:

Step S110: Provide a substrate.

Figure 7:
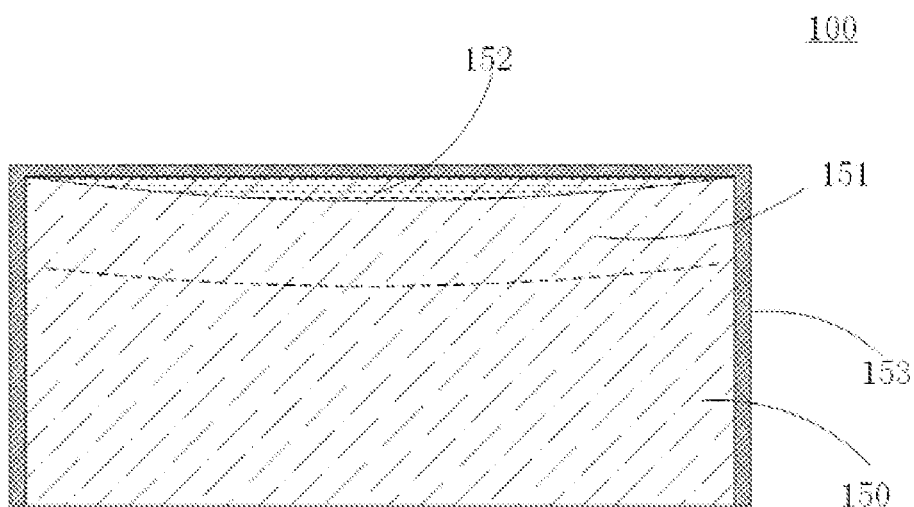
FIG. 7 is a schematic diagram of a substrate according to an exemplary embodiment.

In this embodiment, the providing a substrate 100 includes:

as shown in FIG. 7, providing an initial substrate 150 first, and forming a first doped region 151 in the initial substrate 150. The material of the initial substrate 150 includes a semiconductor material such as silicon (Si), germanium (Ge), silicon germanium (GeSi), or silicon carbide (SiC). The semiconductor material may further be silicon-on-insulator (SOD, germanium-on-insulator (GOD, or another material such as the III-V group compound, namely, gallium arsenide.

Doping ions are implanted into the initial substrate 150 to form a first doped region 151, and the first doped region 151 is of a first conductivity type. The first conductivity type may be a P-type conductivity type or an N-type conductivity type.

Then, a second doped region 152 is formed in the first doped region 151. The doping-ion types of the first doped region 151 and the second doped region 152 are the same or different. In some embodiments, the conductivity type of the second doped region 152 is the same as that of the first doped region 151. In other embodiments, the conductivity type of the second doped region 152 is opposite to that of the first doped region 151.

Next, a first initial dielectric layer 153 is formed, and the first initial dielectric layer 153 covers at least the second doped region 152. In this embodiment, the first initial dielectric layer 153 may be formed by using a deposition process or a thermal oxidation process, and the first initial dielectric layer 153 covers the outer surface of the initial substrate 150. The material of the first initial dielectric layer 153 may include oxide or nitride. For example, the material of the first initial dielectric layer 153 may include one of silicon oxide or silicon nitride.

Step S120: Form a dielectric structure on the substrate, where the dielectric structure covers a partial surface of the substrate.

Figure 8:
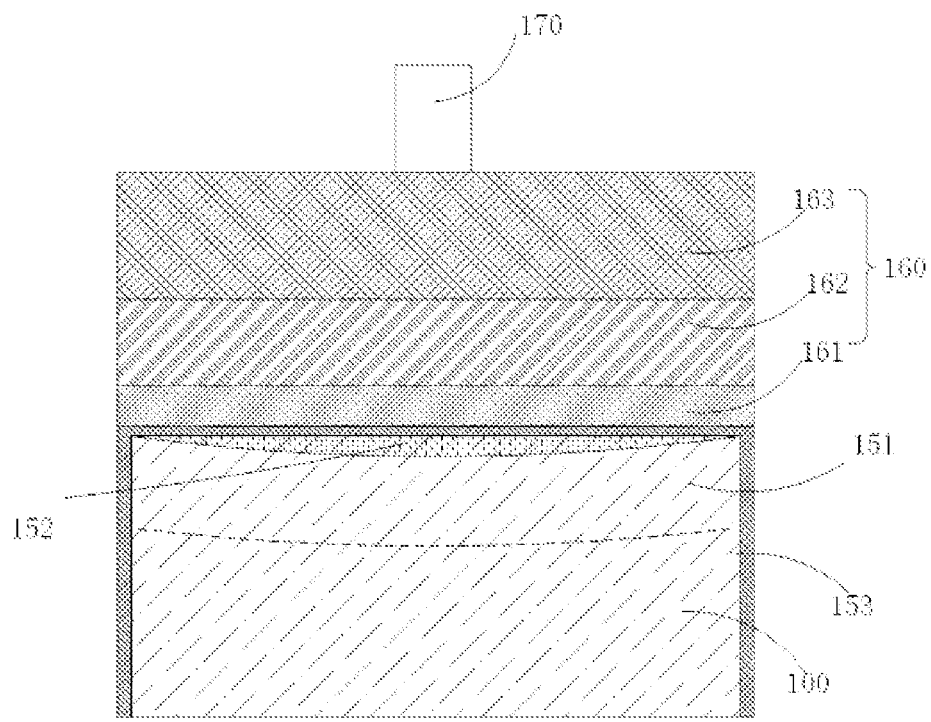
FIG. 8 is a schematic diagram of forming a dielectric material layer according to an exemplary embodiment.

In this embodiment, the dielectric structure 225 may be formed by using the following method:

As shown in FIG. 8, with reference to FIG. 7, a dielectric material layer 160 is formed on the top surface of the substrate 100, and the dielectric material layer 160 covers the first initial dielectric layer 153. The dielectric material layer 160 may be of a single layer or a multi-layer structure. In this embodiment, description is made by using an example in which the dielectric material layer 160 is of a multi-layer structure. Along the direction away from the top surface of the substrate 100, that is, the direction from bottom to top shown in FIG. 8, the dielectric material layer 160 includes a second initial dielectric layer 161, a third initial dielectric layer 162, and a fourth initial dielectric layer 163 that are stacked sequentially. The material of the dielectric material layer 160 includes an insulating material, such as at least one of silicon oxide, silicon nitride or silicon oxynitride. Materials of the second initial dielectric layer 161, the third initial dielectric layer 162 and the fourth initial dielectric layer 163 may be the same or different.

Figure 9:
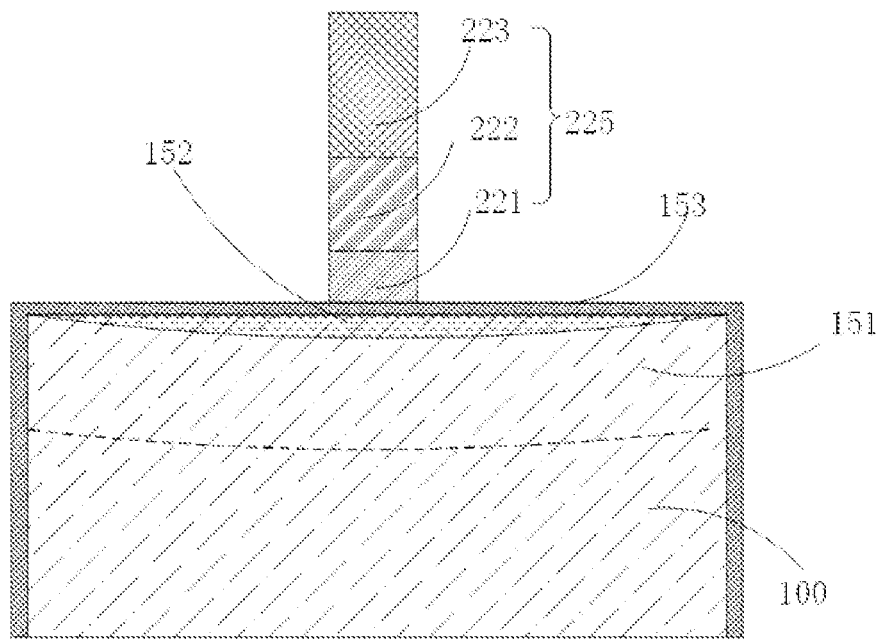
FIG. 9 is a schematic diagram of forming a dielectric structure according to an exemplary embodiment.

As shown in FIG. 8, a mask layer 170 is formed on the top surface of the dielectric material layer 160, and the mask layer 170 covers a part of the top surface of the dielectric material layer 160. As shown in FIG. 9, with reference to FIG. 8, the dielectric material layer 160 is etched according to the mask layer 170, and the remaining dielectric material layer 160 forms the dielectric structure 225. The dielectric structure 225 formed in this embodiment includes a second dielectric layer 221, a third dielectric layer 222, and a fourth dielectric layer 223 that are sequentially disposed on the substrate 100.

Step S130: Form an auxiliary layer partially covering a surface of the substrate at the outside of the dielectric structure, where a horizontal width of the auxiliary layer decreases gradually in a direction away from the substrate.

Figure 10:
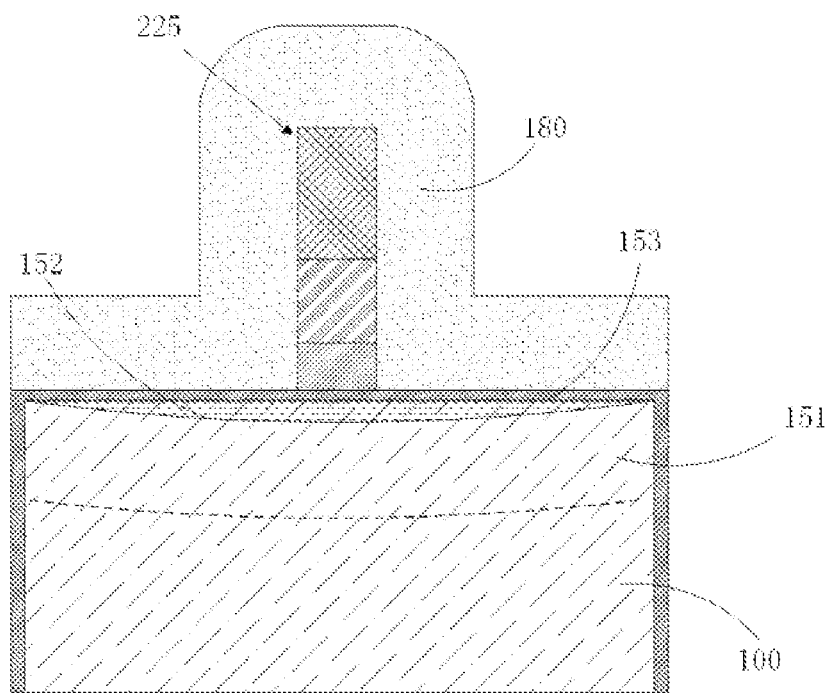
FIG. 10 is a schematic diagram of forming an initial auxiliary layer according to an exemplary embodiment.

The auxiliary layer 181 partially covering the surface of the substrate 100 at the outside of the dielectric structure 225 may be formed by using the following method:

As shown in FIG. 10, with reference to FIG. 9, the initial auxiliary layer 180 is formed. The initial auxiliary layer 180 covers the top surface of the substrate 100 and the outer surface of the dielectric structure 225. On a section perpendicular to the substrate 100, the initial auxiliary layer 180 have a predetermined thickness. In this embodiment, the material of the initial auxiliary layer 180 includes polysilicon.

Figure 11:
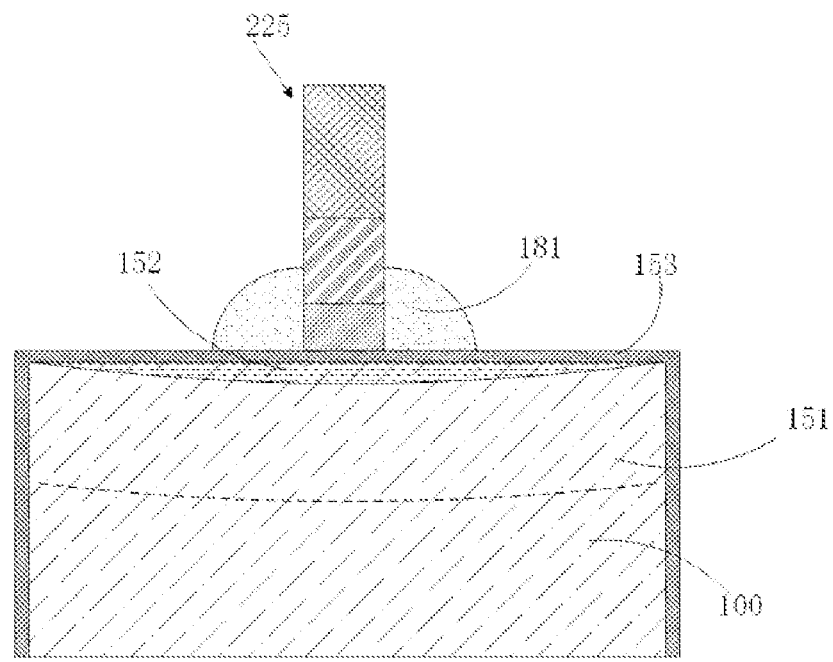
FIG. 11 is a schematic diagram of forming an auxiliary layer according to an exemplary embodiment.

Then, as shown in FIG. 11, with reference to FIG. 10, the initial auxiliary layer 180 is etched, and the speeds at which the initial auxiliary layer 180 is etched in the horizontal direction and in the vertical direction are the same. The initial auxiliary layer 180 covering the top surface of the substrate 100 and the initial auxiliary layer 180 covering the outer surface of the dielectric structure 225 are partly removed. A part of the initial auxiliary layer 180 at the connecting corner between the dielectric structure 225 and the substrate 100 is retained and form the auxiliary layer 181.

As shown in FIG. 11, on a section perpendicular to the substrate 100, the auxiliary layer 181 has a gradually decreasing horizontal width in a direction away from the substrate 100.

Step S140: Pattern the substrate based on the auxiliary layer and the dielectric structure, and transfer a pattern of the auxiliary layer into the substrate.

Figure 12:
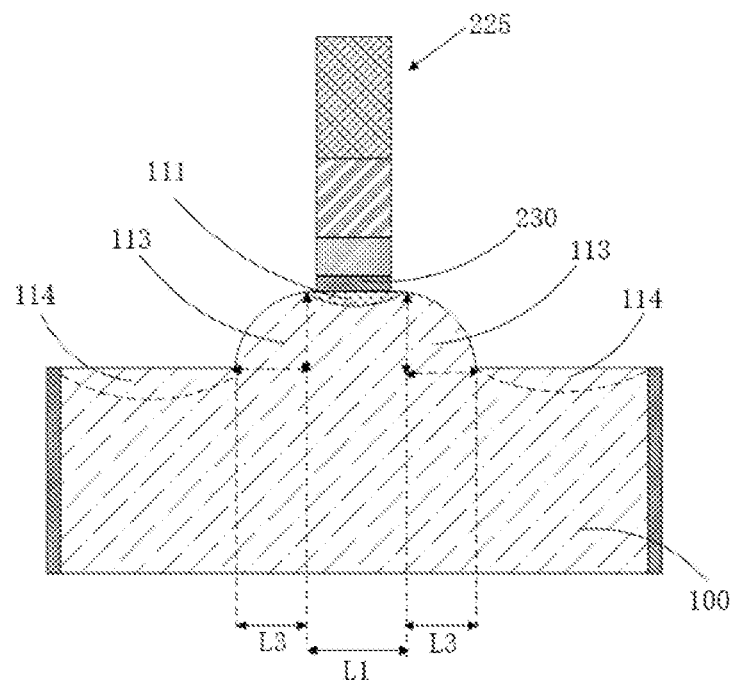
FIG. 12 is a schematic diagram of etching the substrate according to the auxiliary layer and the dielectric structure according to an exemplary embodiment.

As shown in FIG. 12, a pattern of the auxiliary layer 181 is transferred into the substrate 100, and an intermediate doped region 113 with a horizontal width decreasing gradually in the direction away from the substrate 100 is formed in the substrate 100. The substrate 100 below the dielectric structure 225 is unetched, and forms a top doped region 111 with a first width. The substrate 100 that is not covered by the auxiliary layer 181 and the dielectric structure 225 is partially removed through etching, to form an initial bottom doped region 114. The intermediate doped region 113 connects the initial bottom doped region 114 to the top doped region 111.

In this embodiment, the pattern of the auxiliary layer 181 may be transferred into the substrate 100 by using the following method:

As shown in FIG. 12, with reference to FIG. 11, the auxiliary layer 181 and the substrate 100 are synchronously etched by controlling an etch selectivity between the auxiliary layer 181 and the substrate 100, the second doped region 152 that is not covered by the auxiliary layer 181 and the dielectric structure 225 and a part of the first doped region 151 below the second doped region 152 are removed, and at least a part of the first doped region 151 and a part of the second doped region 152 below the auxiliary layer 181 are removed. In this embodiment, the etch selectivity between the auxiliary layer 181 and the substrate 100 may be controlled in a range of 1:1 to 1:2, such as 1:1, 1:1.1, 1:1.2, 1:1.4, 1:1.5, 1:1.7, 1:1.9, or 1:2.

As shown in FIG. 12, the second doped region 152 under the dielectric structure 225 is unetched and forms a top doped region 111 with a first width L1. The topography of the auxiliary layer 181 is transferred to the remaining part of the first doped region 151, to form the intermediate doped region 113. The intermediate doped region 113 has a third width L3 that gradually decreases in a direction away from the initial substrate 150. The retained part of the first doped region 151 below the bottom surface of the intermediate doped region 113 forms the initial bottom doped region 114.

Step S150: Form a stacked structure at least covering the intermediate doped region and a part of the initial bottom doped region, where a part of the initial bottom doped region covered by the stacked structure forms a bottom doped region, the bottom doped region has a second width, and the first width is greater than the second width.

In this embodiment, the forming the stacked structure 200 at least includes: forming a gate dielectric layer 201 covering the intermediate doped region 113 and the bottom doped region 112, where on a section perpendicular to the substrate 100, thicknesses of the gate dielectric layer 201 and the first dielectric layer 230 are the same or different. A first gate conductive layer 212 and a second gate conductive layer 213 covering the gate dielectric layer 201 are formed. On a section perpendicular to the substrate 100, the first gate conductive layer 212 is thinner than the second gate conductive layer 213.

The stacked structure 200 has a variable or fixed width in a direction parallel to the substrate 100. Therefore, when the stacked structure 200 covers the intermediate doped region 113, it also covers a part of the top surface of the initial bottom doped region 114 adjacent to the intermediate doped region 113. The initial bottom doped region 114 covered by the stacked structure 200 forms the bottom doped region 112. The top doped region 111, the intermediate doped region 113, and the bottom doped region 112 jointly form the doped region 110.

In the method of this embodiment, the auxiliary layer and the dielectric structure are used as masks to etch the substrate, thereby forming a doped region. The morphology of the auxiliary layer is transferred to the substrate to form an intermediate doped region. The intermediate doped region makes doped region formed with a fin structure disposed in a direction away from the substrate. The doped region is raised relative to the substrate, and the stacked structure covers the doped region, thereby increasing the contact area between the stacked structure and the doped region.

Figure 27:
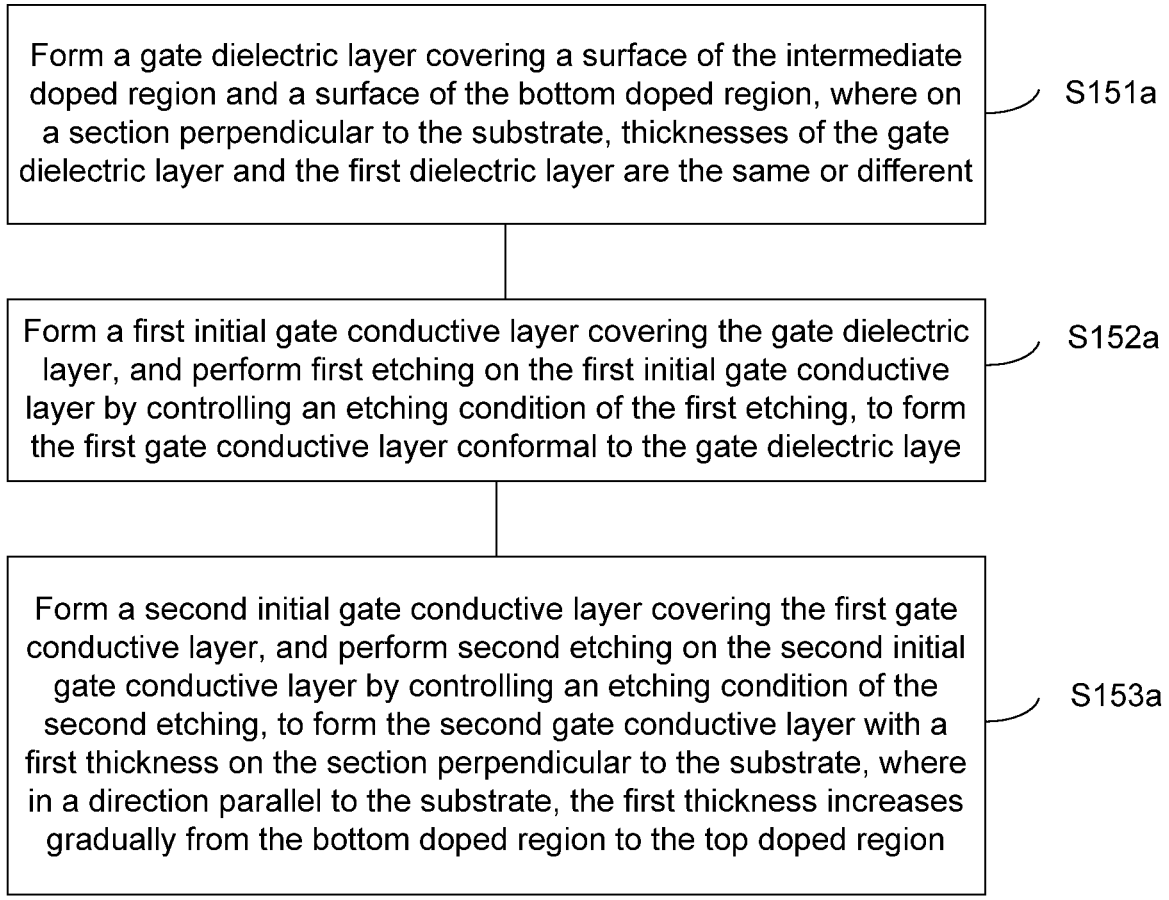
FIG. 27 is a flowchart of forming a stacked structure according to an exemplary embodiment.

According to an exemplary embodiment, this embodiment is a further description of a possible implementation of step S150 in the foregoing embodiment. In this embodiment, the bottom doped region 112, the intermediate doped region 113, and the top doped region 111 of the doped region 110 have the same conductivity type. That is, the bottom doped region 112, the intermediate doped region 113, and the top doped region 111 may all have an N-type conductivity type or a P-type conductivity type. As shown in FIG. 27, during the implementation, the forming a stacked structure at least covering the intermediate doped region and a part of the initial bottom doped region includes:

Step S151a: Form a gate dielectric layer covering a surface of the intermediate doped region and a surface of the bottom doped region, where on a section perpendicular to the substrate, thicknesses of the gate dielectric layer and the first dielectric layer are the same or different.

Figure 13:
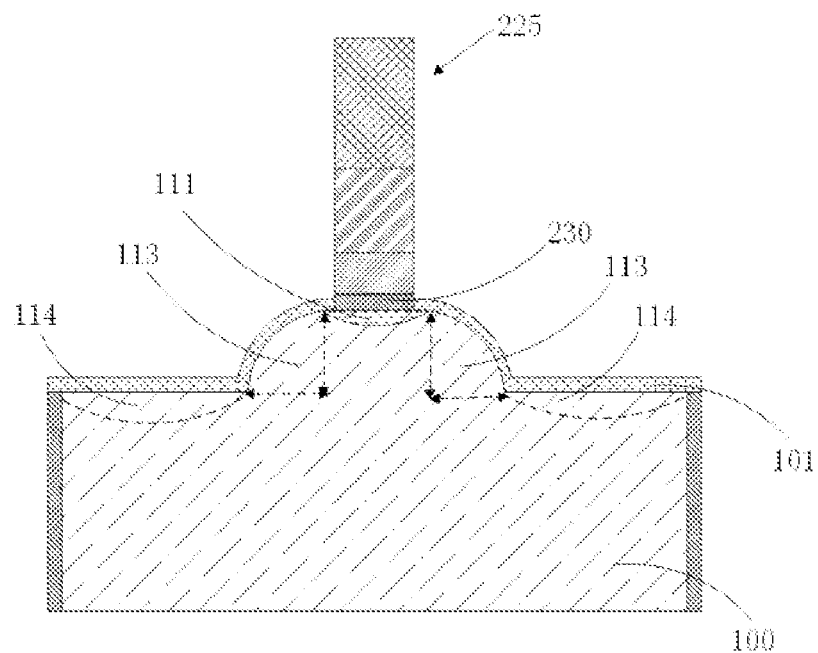
FIG. 13 is a schematic diagram of forming a first oxide layer according to an exemplary embodiment.

The gate dielectric layer 201 may be formed by the following method: as shown in FIG. 13, with reference to FIG. 12, the substrate 100 is treated through a thermal oxidation process to form a first oxide layer 101 on the outer surface of the substrate 100.

Figure 14:
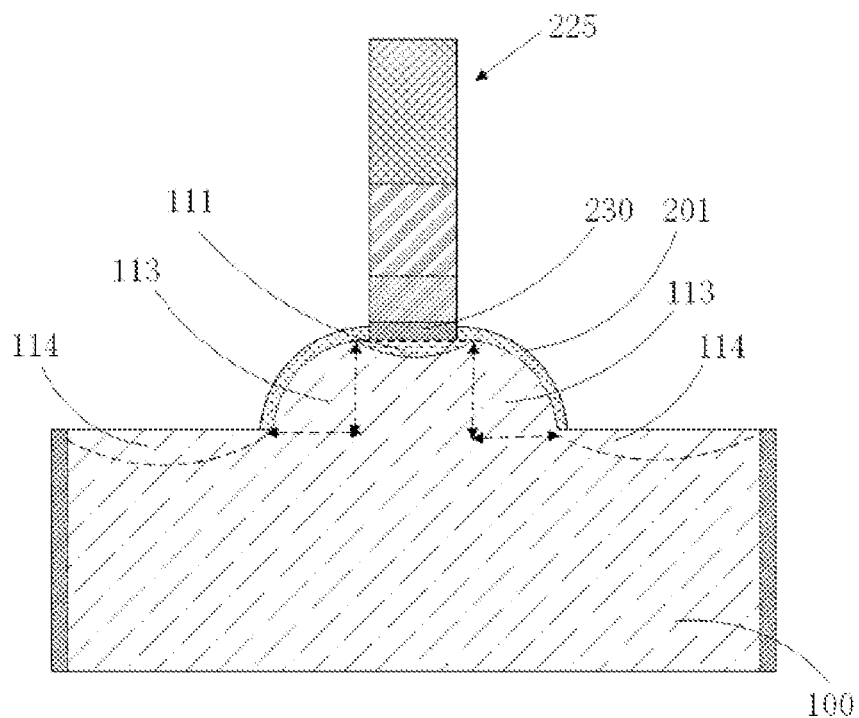
FIG. 14 is a schematic diagram of forming a gate dielectric layer according to an exemplary embodiment.

Then, as shown in FIG. 14, with reference to FIG. 13, a part of the first oxide layer 101 is removed, and a part of the first oxide layer 101 covering the intermediate doped region 113 is retained to form a gate dielectric layer 201.

Step S152a: Form a first initial gate conductive layer covering the gate dielectric layer, and perform first etching on the first initial gate conductive layer by controlling an etching condition of the first etching, to form the first gate conductive layer conformal to the gate dielectric layer.

Figure 15:
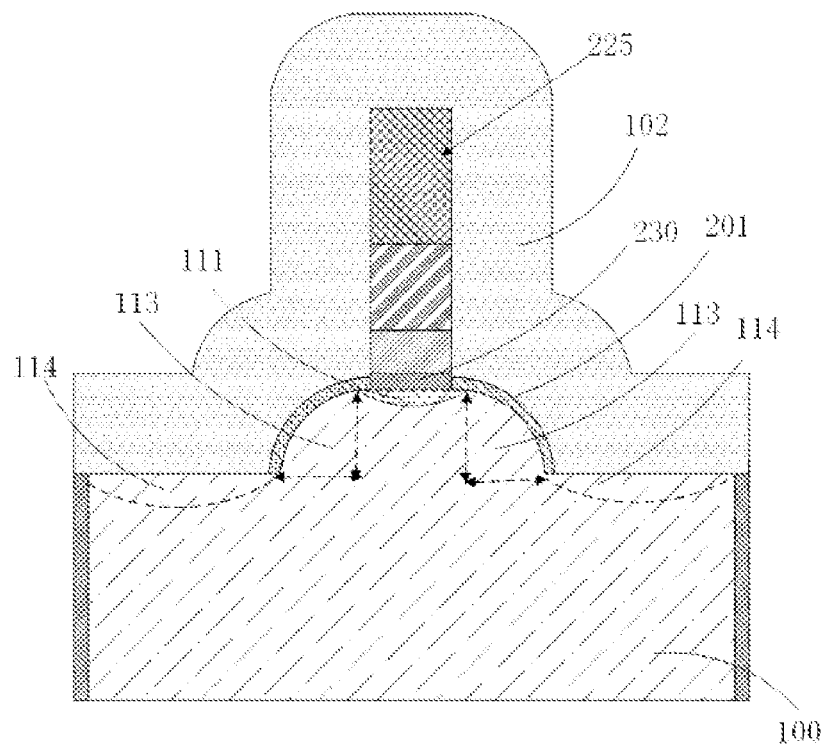
FIG. 15 is a schematic diagram for forming a first initial gate conductive layer according to an exemplary embodiment.

As shown in FIG. 15, with reference to FIG. 14, the first initial gate conductive layer 102 is formed by using an atomic layer deposition (ALD) process or a chemical vapor deposition (CVD) process. The first initial gate conductive layer 102 covers the top surface of the substrate 100, the gate dielectric layer 201, and the outer surface of the dielectric structure 225. Due to the affection of the topography of the outer surface of the intermediate doped region 113, on a section perpendicular to the substrate 100, the first initial gate conductive layer 102 on the intermediate doped region 113 is thicker than the first initial gate conductive layer 102 on the top surface of the substrate 100.

Figure 16:
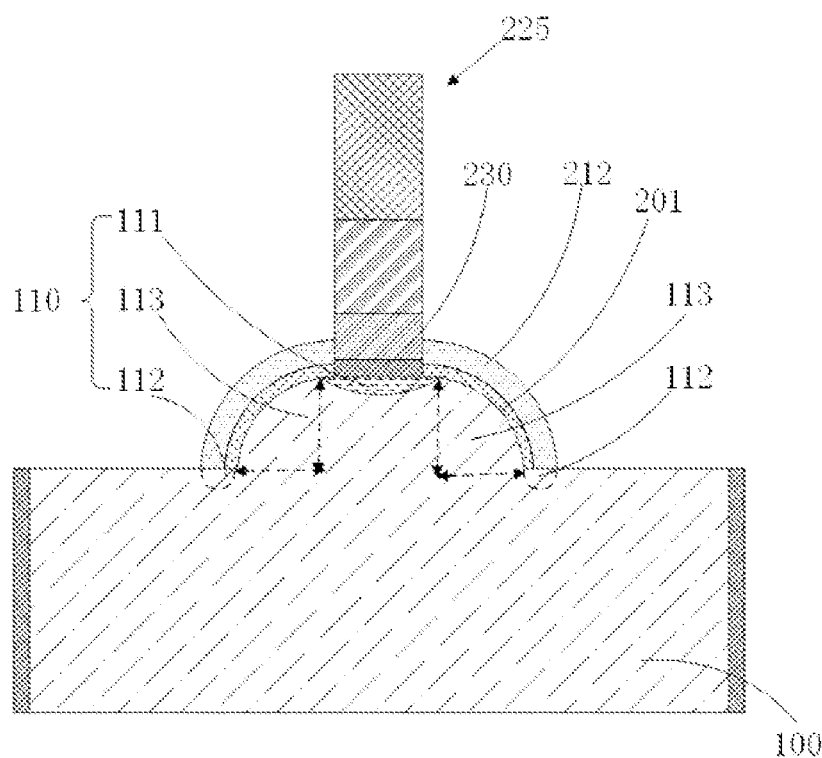
FIG. 16 is a schematic diagram for forming a first gate conductive layer according to an exemplary embodiment.

Then, as shown in FIG. 16, with reference to FIG. 15, first etching is performed on the first initial gate conductive layer 102, and the etching conditions of the first etching are controlled, such that two speeds at which the first initial gate conductive layer 102 is etched in the horizontal direction and in the vertical direction are equal. A part of the first initial gate conductive layer 102 is removed to expose a part of the sidewall of the second dielectric layer 221, and the remaining first initial gate conductive layer 102 forms the first gate conductive layer 212. The first gate conductive layer 212 covers the intermediate doped region 113 and a part of the initial bottom doped region 114 connected to the intermediate doped region 113. A part of the initial bottom doped region 114 covered by the first gate conductive layer 212 forms the bottom doped region 112.

In this embodiment, the material of the first gate conductive layer 212 includes polysilicon. During the deposition of the polysilicon, some doping ions can be doped into the polysilicon to modulate the work function of the first gate conductive layer 212. In the direction perpendicular to the substrate 100, the thickness of the first gate conductive layer 212 is about 20 nm to 35 nm, which is approximately the same as the thickness of the gate electrode in the planar transistor. The thickness of the first gate conductive layer 212 is thin enough to ensure that crystal orientations in the polysilicon in the first gate conductive layer 212 are the same, and the first gate conductive layer 212 has good conductivity. The first gate conductive layer 212 formed in this embodiment has the same morphology as the gate dielectric layer 201, and in the direction parallel to the substrate 100, the thicknesses of parts of the first gate conductive layer 212 are equal.

Step S153a: Form a second initial gate conductive layer covering the first gate conductive layer, and perform second etching on the second initial gate conductive layer by controlling an etching condition of the second etching, to form the second gate conductive layer with a first thickness on the section perpendicular to the substrate, where in a direction parallel to the substrate, the first thickness increases gradually from the bottom doped region to the top doped region.

Figure 17:
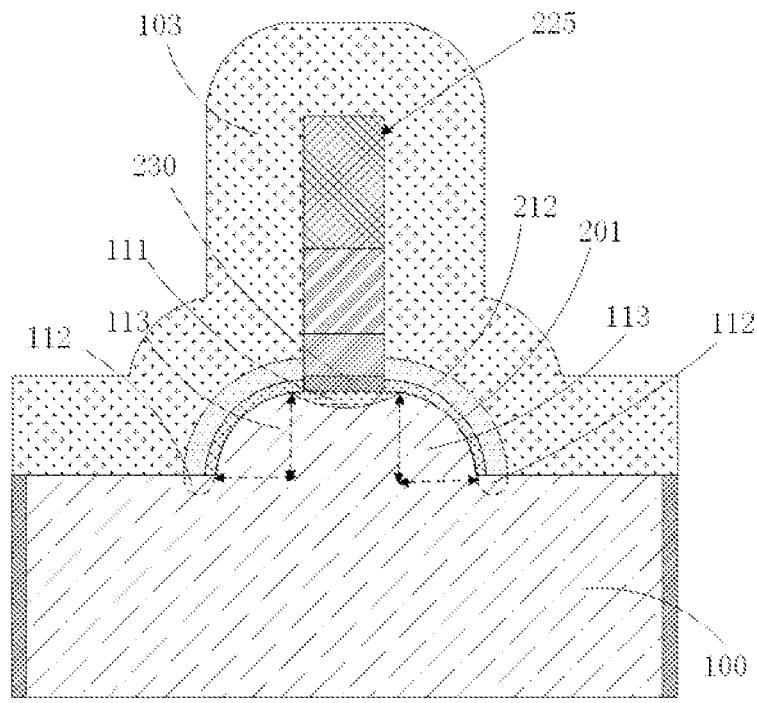
FIG. 17 is a schematic diagram for forming a second initial gate conductive layer according to an exemplary embodiment.

First, as shown in FIG. 17, with reference to FIG. 16, a metal conductive material is deposited through the atomic layer deposition process or the chemical vapor deposition process to form a second initial gate conductive layer 103. The second initial gate conductive layer 103 covers the top surface of the substrate 100, the first gate conductive layer 212, and the outer surface of the dielectric structure 225. The metal conductive material may include one of metal titanium, metal tantalum, metal tungsten or an alloy thereof.

Then, as shown in FIG. 1, with reference to FIG. 17, second etching is performed on the second initial gate conductive layer 103, and the etching conditions of the second etching are controlled, such that the second initial gate conductive layer 103 in the vertical direction is etched faster than it is done in the horizontal direction. The retained second initial gate conductive layer 103 forms a second gate conductive layer 213. The second gate conductive layer 213 formed in this embodiment has a first thickness D1 on the section perpendicular to the substrate. In a direction parallel to the substrate 100, from the bottom doped region 112 to the top doped region 111, the first thickness D1 gradually increases.

As shown in FIG. 1, with reference to FIG. 17, in this embodiment, while the second initial gate conductive layer 103 is etched, the dielectric structure 225 is etched. Speeds at which the second initial gate conductive layer 103 is etched and the dielectric structure 225 is etched in the vertical direction are the same. The retained dielectric structure 225 forms a dielectric stack structure 220, and the top surface of the dielectric stack structure 220 is higher than the top surface of the second gate conductive layer 213.

As shown in FIG. 1, and with reference to FIG. 17, the semiconductor structure formed in this embodiment uses the gate dielectric layer 201 as the gate dielectric layer 211.

In the stacked structure formed in this embodiment, the entire second gate dielectric layer is located above the first gate conductive layer. The second gate dielectric layer and the substrate do not have a direct overlapping region, and the second gate dielectric layer is in contact with the substrate through the first gate conductive layer. Moreover, on a cross section parallel to the substrate, the first gate conductive layer is relatively uniformly thick. The first gate conductive layer has a good work function adjustment effect, and prevents the metal conductive material in the second gate conductive layer from affecting the threshold voltage of the transistor, thereby ensuring that the transistor with the stacked structure and the doped region of this embodiment has good sensitivity.

In the transistor with the stacked structure and the doped region of this embodiment, the part of the doped region covered by the gate stack structure is used as the channel. The gate stack structure surrounds the channel, which increases the contact area between the gate stack structure and the channel, and increases the ability of the gate of the transistor to control the channel.

Figure 28:
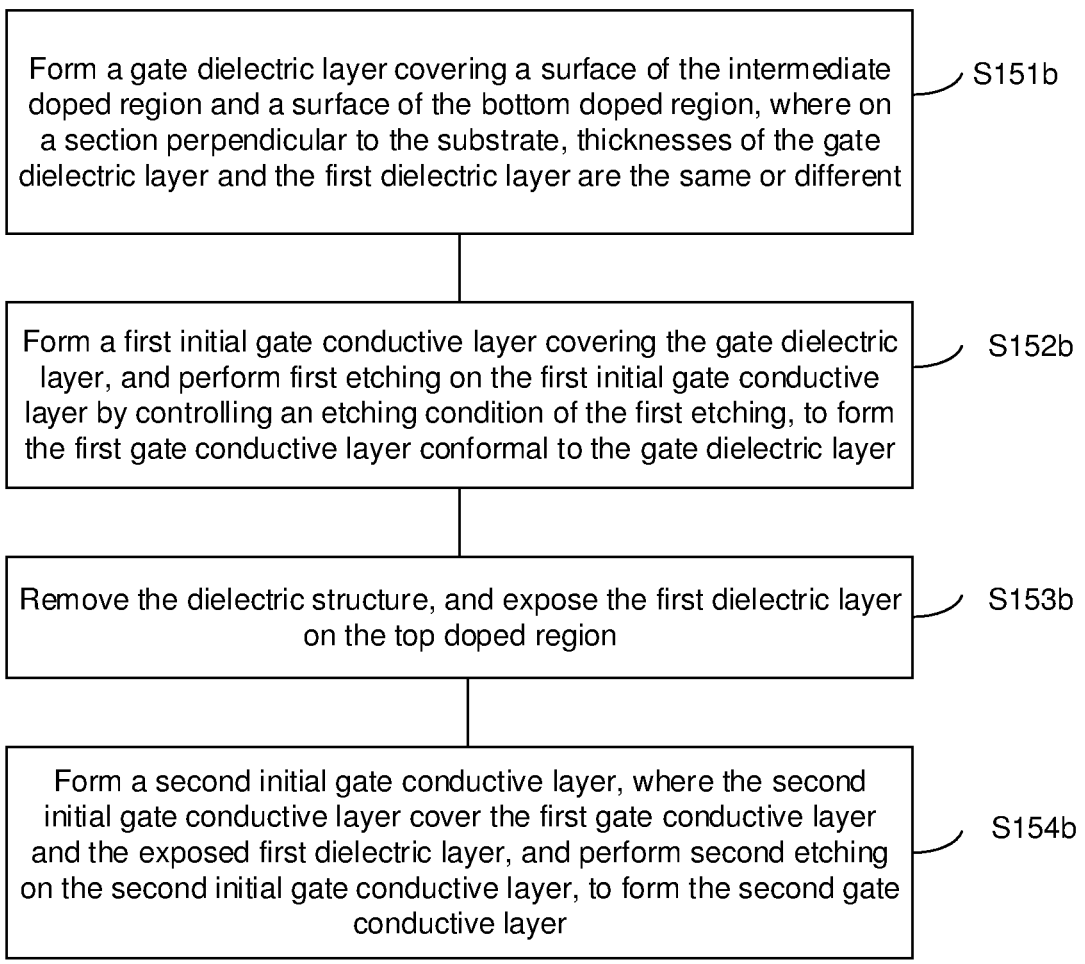
FIG. 28 is a flowchart of the method of manufacturing a semiconductor structure according to an exemplary embodiment.

According to an exemplary embodiment, this embodiment is a further description of a possible implementation of step S150 in the foregoing embodiment. In this embodiment, the bottom doped region 112 and the intermediate doped region 113 of the doped region 110 have the same conductivity type. The top doped region 111 and the intermediate doped region 113 have different doping types. In other words, in this embodiment, the bottom doped region 112 and the intermediate doped region 113 may both have the N-type conductivity type, and the top doped region 111 has the P-type conductivity type, or vice versa. As shown in FIG. 28, during the implementation of this embodiment, the forming a stacked structure at least covering the intermediate doped region and a part of the initial bottom doped region includes:

Step S151b: Form a gate dielectric layer covering a surface of the intermediate doped region and a surface of the bottom doped region, where on a section perpendicular to the substrate, thicknesses of the gate dielectric layer and the first dielectric layer are the same or different.

Figure 23:
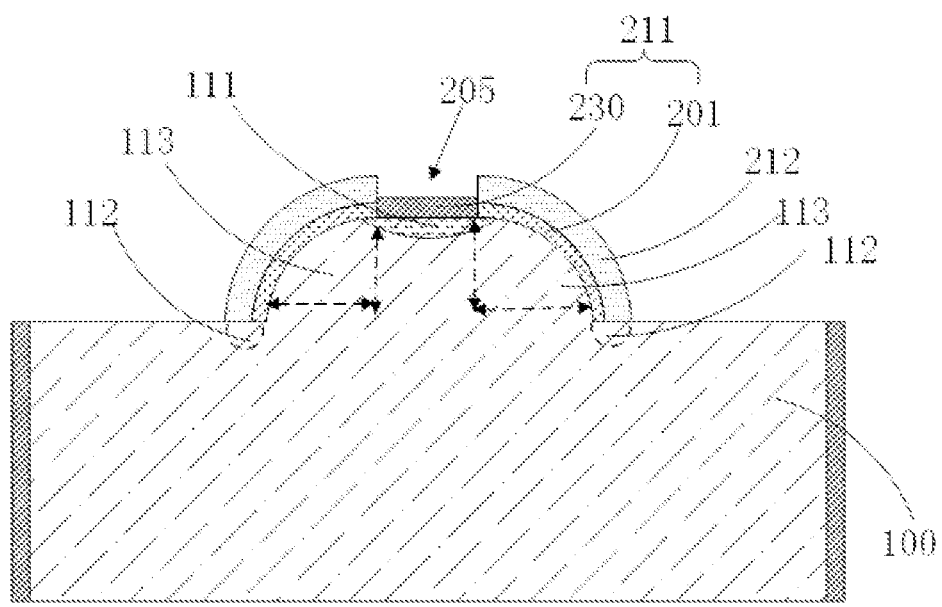
FIG. 23 is a schematic diagram of removing the dielectric structure according to an exemplary embodiment.

In this embodiment, with reference to FIG. 23, the implementation manner of forming the gate dielectric layer 201 is the same as that of the gate dielectric layer 201 in step S151a in the above embodiment. Details are not repeated here.

Step S152b: Form a first initial gate conductive layer covering the gate dielectric layer, and perform first etching on the first initial gate conductive layer by controlling an etching condition of the first etching, to form the first gate conductive layer conformal to the gate dielectric layer.

In this embodiment, with reference to FIG. 23, the implementation manner of forming the first gate conductive layer 212 is the same as that of the first gate conductive layer 212 in step S152a in the foregoing embodiment. Details are not repeated here.

Step S153b: Remove the dielectric structure, and expose the first dielectric layer on the top doped region.

As shown in FIG. 23, with reference to FIG. 16, the entire dielectric structure 225 may be removed through dry etching or wet etching to expose the first dielectric layer 230. The first dielectric layer 230 and the first gate conductive layer 212 form a groove 205 above the top doped region 111.

Step S154b: Form a second initial gate conductive layer, where the second initial gate conductive layer cover the first gate conductive layer and the exposed first dielectric layer, and perform second etching on the second initial gate conductive layer, to form the second gate conductive layer.

Figure 24:
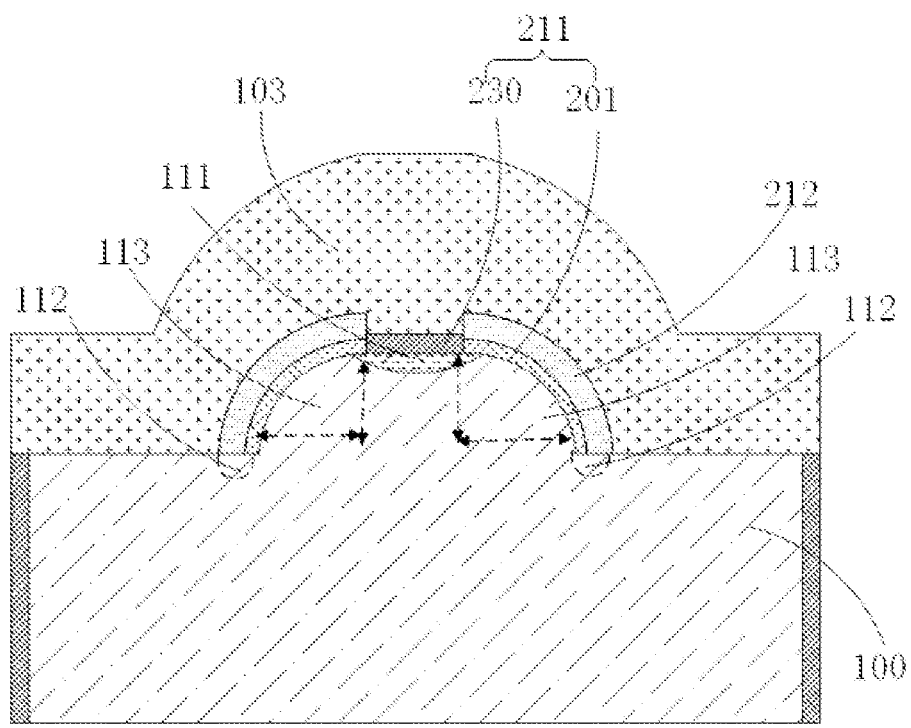
FIG. 24 is a schematic diagram for forming the second initial gate conductive layer according to an exemplary embodiment.

As shown in FIG. 24, with reference to FIG. 23, a metal conductive material is deposited through the atomic layer deposition process or the chemical vapor deposition process to form a second initial gate conductive layer 103. The second initial gate conductive layer 103 covers the top surface of the substrate 100 and the first gate conductive layer 212 and covers the groove 205. The metal conductive material is the same as the material of the second initial gate conductive layer 103 in the foregoing embodiment.

Then, as shown in FIG. 4, with reference to FIG. 24, the second etching is performed on the second initial gate conductive layer 103, and the etching conditions of the second etching are controlled, such that the second initial gate conductive layer 103 in the vertical direction is etched faster than it is done in the horizontal direction. The entire second initial gate conductive layer 103 located on the top surface of the substrate 100 is removed and a part of the sidewall of the first gate conductive layer 212 connected to the substrate 100 is exposed, and the remaining second initial gate conductive layer 103 forms a second gate conductive layer 213.

As shown in FIG. 4, in this embodiment, the first dielectric layer 230 and the gate dielectric layer 201 together form the gate dielectric layer 211. The first gate conductive layer 212 is in contact with the bottom doped region 112 and the intermediate doped region 113 through the gate dielectric layer 201. A part of the second gate conductive layer 213 is located on the first gate conductive layer 212, and another part of the second gate conductive layer 213 is in contact with the top doped region 111 through the first dielectric layer 230.

The stacked structure formed in this embodiment only includes a gate stack structure, and the second gate conductive layer not only covers a part of the second gate conductive layer, but also fills the groove defined by the first gate conductive layer and the first dielectric layer, to increase the percentage of the second gate conductive layer in the gate stack structure, thereby improving the electrical performance of the semiconductor structure.

According to an exemplary embodiment, this embodiment is a further description of the foregoing embodiment. Compared with the foregoing embodiment, after step S150, the following steps are added to this embodiment.

Step S160: Perform a doping process on the substrates at two sides of the stacked structure to form a first lightly doped region and a second lightly doped region in the substrate.

Figure 18:
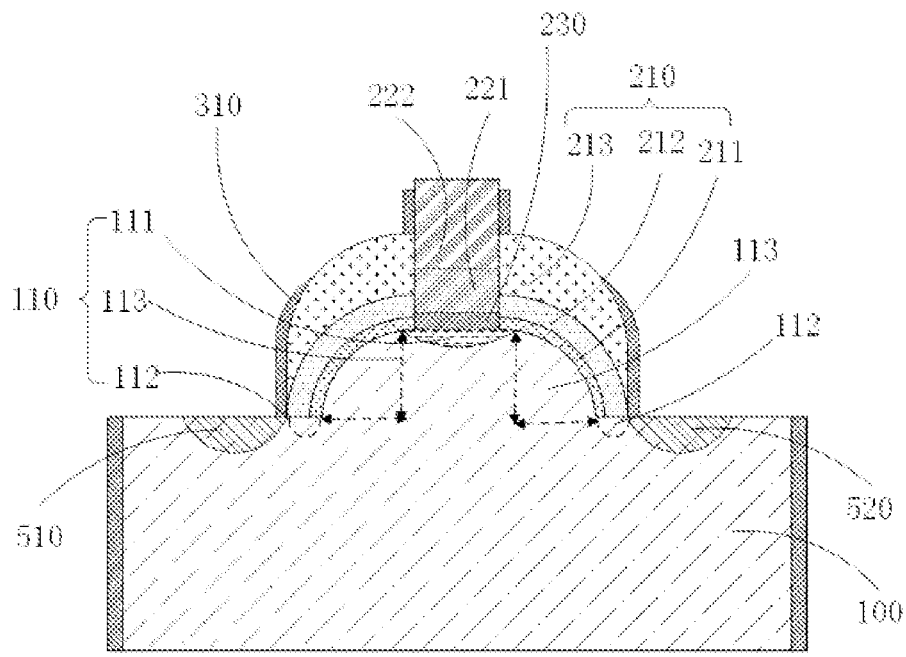
FIG. 18 is a schematic diagram of forming a first lightly doped region and a second lightly doped region according to an exemplary embodiment.

As shown in FIG. 5 or 18, with reference to FIG. 1 or 4, in this embodiment, the sidewall of the stacked structure 200 is used as a mask to implant doping ions into the substrate 100, such that a first lightly doped region 510 and a second lightly doped region 520 are formed in the substrate 100 at two sides of the stacked structure 200. The first lightly doped region 510 is connected to the bottom doped region 112, and the second lightly doped region 520 is connected to the bottom doped region 112.

Step S170: Form an isolation structure at least covering the stacked structure.

As shown in FIG. 2 or 5, with reference to FIG. 4 or 18, in this embodiment, to form the isolation structure 300, the following methods may be used: an isolation material is deposited. The isolation material covers the outer surface of the stacked structure 200 and covers the top surface of the substrate 100. Then, a part of the isolation material is removed through etching to expose the top surface of the substrate 100. The retained isolation material forms the isolation structure 300, and the isolation structure 300 covers the stacked structure 200.

Step S180: Perform a source-drain doping process on the substrate by using the isolation structure as a mask, and form a source region and a drain region in the substrate.

With reference to FIG. 2 or 5, the isolation structure 300 is used as a mask, to implant doping ions into the substrate 100 outside the isolation structure 300 through an ion implantation process or a diffusion process, such that a source region 410 and a drain region 420 are formed at two sides of the stacked structure 200.

As shown in FIG. 2 or 5, the first lightly doped region 510 and the source region 410 have a partial overlapping region, and a part of the first lightly doped region 510 is located between the source region 410 and the bottom doped region 112 to block the diffusion of the first doping ions of the source region 410 toward the bottom doped region 112. Likewise, the second lightly doped region 520 blocks the diffusion of the first doping ions of the drain region 420 toward the bottom doped region 112. By reducing the overlapping region among the source region 410, the drain region 420 and the gate stack structure 210, the problem of gate-induced drain current leakage in the formed semiconductor structure can be reduced or avoided.

Step S190: Form a second plug perpendicular to the top surface of the substrate, where the second plug is in contact with the source region, and form a third plug perpendicular to the top surface of the substrate, where the third plug is in contact with the drain region.

In this embodiment, description is made by using a solution in which the stacked structure 200 includes the gate stack structure 210 and the dielectric stack structure 220.

Figure 20:
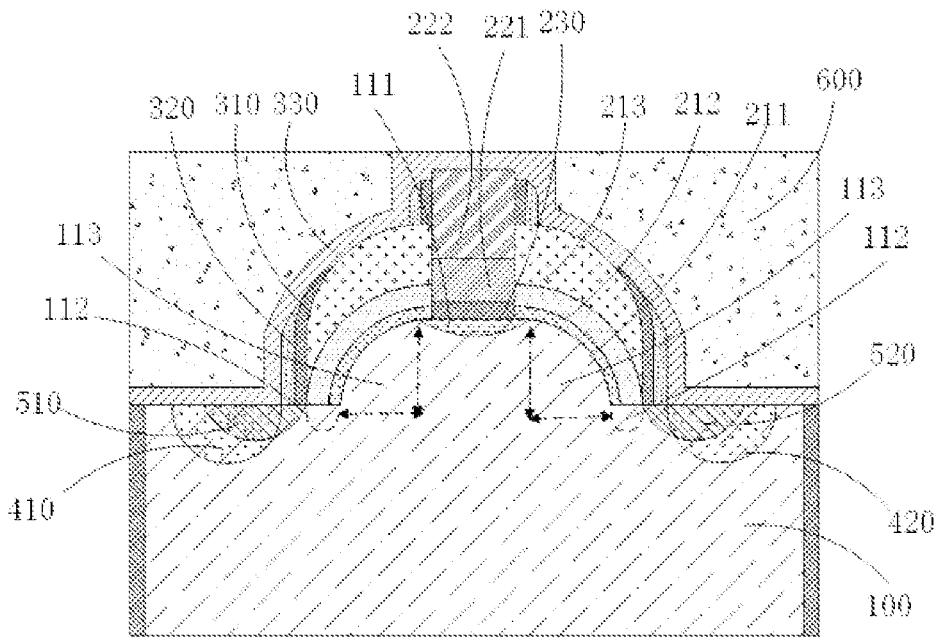
FIG. 20 is a schematic diagram of forming a dielectric layer according to an exemplary embodiment.

As shown in FIG. 20, with reference to FIG. 2, first, a dielectric material is deposited to cover the substrate 100 and the stacked structure 200, and the top surface of the dielectric material is higher than the top surface of the stacked structure 200. Then, the dielectric material is etched back to expose the top surface of the isolation structure 300, and form the dielectric layer 600.

Figure 21:
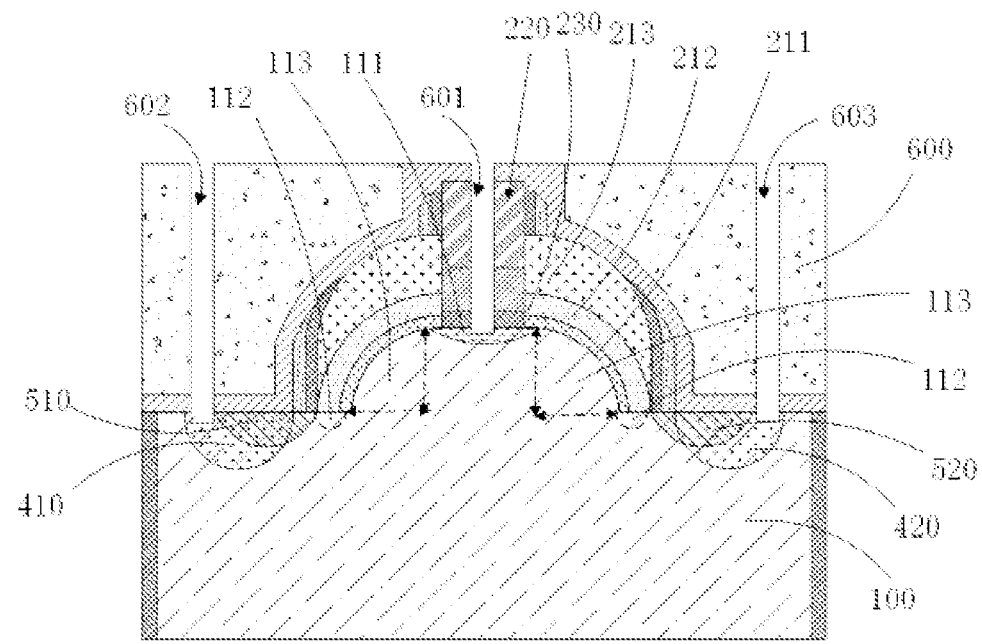
FIG. 21 is a schematic diagram of forming a first trench, a second trench, and a third trench in the dielectric layer according to an exemplary embodiment.

As shown in FIG. 21, with reference to FIG. 20, a part of the dielectric layer 600, a part of the dielectric stack structure 220, and a part of the substrate 100 are removed to form a second trench 602 and a third trench 603. The second trench 602 extends into the substrate 100 and exposes a part of the source region 410. The third trench 603 extends into the substrate 100 and exposes a part of the drain region 420.

Then, with reference to FIG. 21, a barrier material (not shown in the figure) is deposited, and the barrier material covers the inner wall of the second trench 602 and the inner wall of the third trench 603. The barrier material may include titanium or a titanium compound, or tantalum or a tantalum compound.

Figure 22:
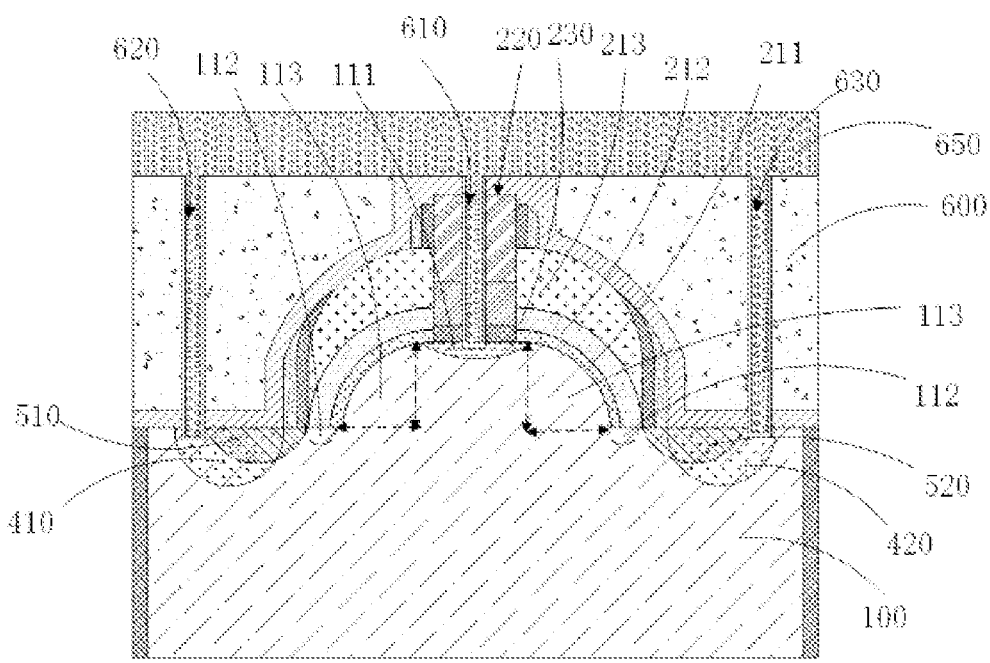
FIG. 22 is a schematic diagram of forming a first plug, a second plug, and a third plug in the dielectric layer according to an exemplary embodiment.

Next, as shown in FIG. 22, with reference to FIG. 21, the second trench 602 and the third trench 603 are respectively filled with a metal material. On a section perpendicular to the substrate 100, the metal material in the second trench 602 forms a second plug 620 perpendicular to the top surface of the substrate 100, and the second plug 620 is in contact with the source region 410. The metal material in the third trench 603 forms a third plug 630 perpendicular to the top surface of the substrate 100, and the third plug 630 is in contact with the drain region 420. The metal material may include tungsten or a tungsten compound.

In this embodiment, a part of the metal material forms the metal layer 650, and the metal layer 650 covers the top surface of the dielectric layer 600 and covers the stacked structure 200. Both the second plug 620 and the third plug 630 are in contact with the metal layer 650. The second plug 620 and the third plug 630 may connect the source region 410 and the drain region 420 to other semiconductor structures or devices through the metal layer 650.

In some embodiments, as shown in FIG. 3, with reference to FIG. 22, a plurality of insulating structures 651 are formed in the metal layer 650, and divide the metal layer 650 into a plurality of independently arranged parts. The second plug 620 and the third plug 630 are respectively connected to different parts of the metal layer 650, and the second plug 620 and the third plug 630 may be connected to the same device or different ones through different parts of the metal layer 650.

According to an exemplary embodiment, this embodiment is a further description of a possible implementation of the foregoing embodiment. The isolation structure 300 may be of a single-layer structure or a multi-layer structure. In this embodiment, the isolation structure 300 is of a multi-layer structure, and the isolation structure 300 includes a first isolation layer 310, an intermediate isolation layer 320, and an outer isolation layer 330.

Figure 19:
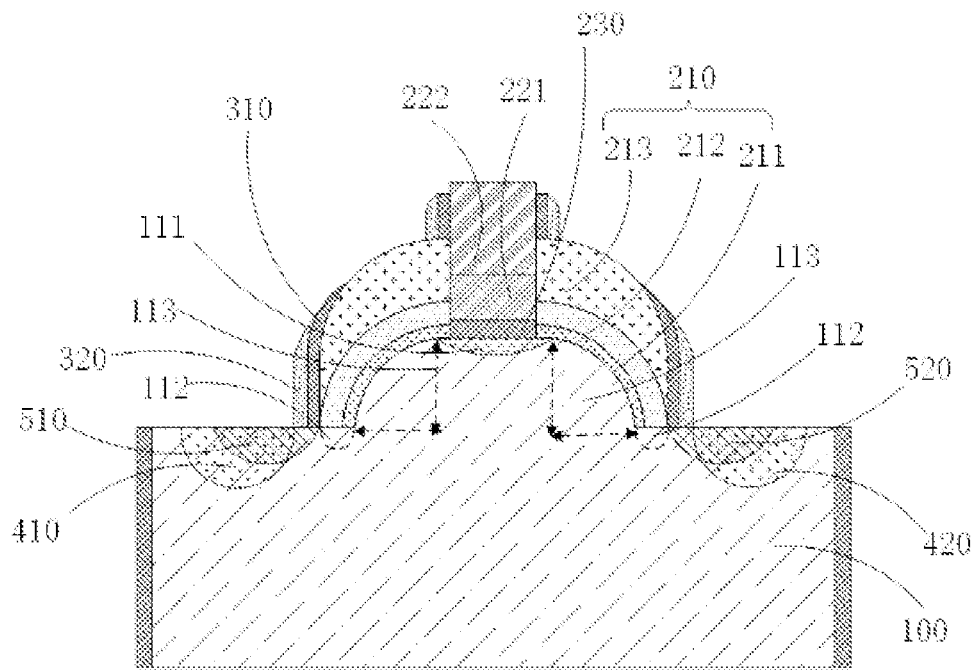
FIG. 19 is a schematic diagram of forming a source region and a drain region according to an exemplary embodiment.

In this embodiment, description is made by using a solution in which the stacked structure 200 includes the gate stack structure 210 and the dielectric stack structure 220. In this embodiment, the formation of the isolation structure 300 includes:

First, as shown in FIG. 18, with reference to FIG. 17, a first isolation layer 310 is formed and covers at least a part of the outer surface of the stacked structure 200 and a part of the top surface of the substrate 100 adjacent to the stacked structure 200. Then, as shown in FIG. 19, with reference to FIG. 18, the intermediate isolation layer 320 is formed and covers at least the first isolation layer 310 and a part of the top surface of the substrate 100 adjacent to the first isolation layer 310. Next, as shown in FIG. 2, with reference to FIG. 19, the outer isolation layer 330 is formed and covers the intermediate isolation layer 320 and the uncovered outer surface of the stacked structure 200.

According to an exemplary embodiment, this embodiment is a further description of a possible implementation of the foregoing embodiment. Compared with the foregoing embodiments, the following step is added to this embodiment: forming a first plug, where in a direction perpendicular to the substrate, the first plug penetrates through the dielectric structure and the first dielectric layer, and is in contact with the top doped region.

As shown in FIG. 2, the stacked structure 200 of the semiconductor structure of this embodiment includes a gate stack structure 210 and a dielectric stack structure 220. In this embodiment, as shown in FIG. 21, while the second trench 602 and the third trench 603 are formed, a part of the dielectric stack structure 220 is removed to form the first trench 601, and the first trench 601 extends into the substrate 100 and exposes a part of the top doped region 111. As shown in FIG. 22, the first plug 610 is formed by filling the first trench 601 with a metal material. The first plug 610 is configured to connect the gate stack structure 210 to the metal layer 650, and connect the gate stack structure 210 to other semiconductor structures or devices through the metal layer 650. In some embodiments, with reference to FIG. 3, the first plug 610, the second plug 620 and the third plug 630 are respectively connected to different parts of the metal layer 650. The first plug 610, the second plug 620, and the third plug 630 may be connected to the same device or different ones through different parts of the metal layer 650.

According to an exemplary embodiment, in the semiconductor structure of this embodiment, the stacked structure 200 only includes the gate stack structure 210. Compared with the foregoing embodiments, the following step is added to this embodiment: forming a fourth plug, where in a direction perpendicular to the substrate, the fourth plug is in contact with the top doped region.

As shown in FIG. 25, with reference to FIG. 21, in the process of forming the second trench 602 and the third trench 603, a fourth trench (not shown in the figure) is simultaneously formed. The fourth trench exposes a part of the top doped region 111, and then a barrier material is deposited to cover the walls of the fourth trench. Next, a metal material is filled in the fourth trench, the metal material in the fourth trench forms a fourth plug 640, and the fourth plug 640 is in contact with the metal layer 650. The fourth plug 640 may connect the gate stack structure 210 to other semiconductor structures or devices through the metal layer 650. In some embodiments, with reference to FIG. 6, the fourth plug 640, the second plug 620 and the third plug 630 are respectively connected to different parts of the metal layer 650. The fourth plug 640, the second plug 620, and the third plug 630 may be connected to the same device or different ones through different parts of the metal layer 650.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the semiconductor structure and a manufacturing method thereof provided by embodiments of the present disclosure, a stacked structure of the semiconductor structure covers a doped region. The doped region includes an intermediate doped region. In a direction parallel to a substrate, a width of the intermediate doped region gradually decreases along a direction away from the substrate, such that the doped region is enabled to be of a fin-shaped structure that protrudes outward relative to the substrate, thereby increasing a contact area between stacked structure and the doped region.

The invention claimed is:
1. A semiconductor structure, comprising:
a substrate and a stacked structure located on the substrate;
a doped region located between the stacked structure and the substrate, wherein on a section perpendicular to the substrate, the doped region comprises a top doped region, a bottom doped region, and an intermediate doped region connecting the top doped region to the bottom doped region, in a direction parallel to the substrate, the top doped region has a first width, the bottom doped region has a second width, the intermediate doped region has a gradually changing third width, the first width is greater than the second width, and the gradually changing third width decreases gradually along a direction away from the substrate;

wherein the stacked structure comprises a gate stack structure, the gate stack structure comprises a gate dielectric layer in contact with the doped region, and a first gate conductive layer and a second gate conductive layer on the gate dielectric layer, and on the section perpendicular to the substrate, the first gate conductive layer is thinner than the second gate conductive layer; and the stacked structure further comprises a dielectric stack structure on the top doped region, the gate stack structure is located on the intermediate doped region and the bottom doped region, and a top surface of the dielectric stack structure is higher than a top surface of the gate stack structure.

2. The semiconductor structure according to claim 1, wherein on the section perpendicular to the substrate, the second gate conductive layer has a first thickness; and in the direction parallel to the substrate, the first thickness increases gradually from the bottom doped region to the top doped region.

3. The semiconductor structure according to claim 1, further comprising a first dielectric layer, wherein the first dielectric layer is located between the stacked structure and the top doped region, the gate dielectric layer is connected to the first dielectric layer, the gate dielectric layer is in contact with the first gate conductive layer, and the first dielectric layer is in contact with the second gate conductive layer; and on the section perpendicular to the substrate, thicknesses of the gate dielectric layer and the first dielectric layer are the same or different.

4. The semiconductor structure according to claim 1, wherein the dielectric stack structure comprises a second dielectric layer and a third dielectric layer, on the section perpendicular to the substrate, a top surface of the second dielectric layer is higher than a top surface of the first gate conductive layer, the top surface of the second dielectric layer is lower than a top surface of the second gate conductive layer, and a top surface of the third dielectric layer is higher than the top surface of the second gate conductive layer.

5. The semiconductor structure according to claim 1, further comprising a first plug, wherein the first plug penetrates through the dielectric stack structure, and is in contact with the top doped region.

6. The semiconductor structure according to claim 1, wherein the first gate conductive layer comprises a work function regulating material, and the second gate conductive layer comprises a metal conductive material.

7. The semiconductor structure according to claim 1, wherein doping types of the bottom doped region and the intermediate doped region are the same, and doping types of the top doped region and the intermediate doped region are the same or different.

8. The semiconductor structure according to claim 1, further comprising an isolation structure covering the stacked structure.

9. The semiconductor structure according to claim 8, further comprising a source region and a drain region that are disposed in the substrate, and are located at two sides of the stacked structure respectively.

10. The semiconductor structure according to claim 9, further comprising:

a second plug, wherein the second plug is disposed perpendicular to the substrate, and is in contact with the source region; and a third plug, wherein the third plug is disposed perpendicular to the substrate, and is in contact with the drain region.

\* \* \* \* \*